(12) United States Patent
Ishida et al.

(10) Patent No.: US 8,564,100 B2
(45) Date of Patent: Oct. 22, 2013

(54) SEMICONDUCTOR DEVICE

(75) Inventors: Masahiro Ishida, Kanagawa (JP);
Toshinori Nishimura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 57 days.

(21) Appl. No.: 13/154,693

(22) Filed: Jun. 7, 2011

(65) Prior Publication Data
US 2011/0304061 A1 Dec. 15, 2011

(30) Foreign Application Priority Data

Jun. 15, 2010 (JP) ................................. 2010-135855

(51) Int. Cl.
*H01L 23/544* (2006.01)
*H01L 21/70* (2006.01)
*H01L 21/00* (2006.01)

(52) U.S. Cl.
USPC .................. 257/620; 257/524; 257/E21.523; 438/113

(58) Field of Classification Search
USPC ........... 257/620, 524, E21.523; 438/113, 462
See application file for complete search history.

(56) References Cited

U.S. PATENT DOCUMENTS

| | | | | |
|---|---|---|---|---|
| 5,675,179 A * | 10/1997 | Shu et al. | ...................... | 257/668 |
| 6,791,197 B1 * | 9/2004 | Katz | .............................. | 257/786 |
| 2005/0263885 A1 * | 12/2005 | Nakamura et al. | ............ | 257/737 |
| 2008/0150101 A1 * | 6/2008 | White et al. | ................... | 257/668 |
| 2008/0164469 A1 * | 7/2008 | Kim et al. | ........................ | 257/48 |
| 2008/0272368 A1 * | 11/2008 | Do et al. | .......................... | 257/40 |
| 2009/0191667 A1 * | 7/2009 | Higashino et al. | ............ | 438/109 |
| 2009/0243044 A1 * | 10/2009 | Tanaka et al. | .................. | 257/618 |
| 2009/0243118 A1 * | 10/2009 | Akiba et al. | ................... | 257/773 |
| 2010/0127355 A1 * | 5/2010 | Mariani et al. | ................. | 257/620 |

FOREIGN PATENT DOCUMENTS

| | | |
|---|---|---|
| JP | 2-130946 | 5/1990 |
| JP | 6-053266 | 2/1994 |

* cited by examiner

*Primary Examiner* — Daniel Luke
*Assistant Examiner* — Khaja Ahmad
(74) *Attorney, Agent, or Firm* — McDermott Will & Emery LLP

(57) ABSTRACT

A semiconductor device in which it is possible to suppress short-circuiting between pads for chip arising from dicing processing is provided. The semiconductor device includes a semiconductor substrate, multiple first pads, and multiple second pads. The first pads are formed in an element formation region and the second pads are formed in a dicing line region surrounding the element formation region. The dicing line region includes a first region for which second pads are prone to electrically short-circuit to each other and a second region for which second pads are less prone to electrically short-circuit to each other. Some first pads arranged in positions opposite the first region are arranged farther away from one side of the outer edge of the element formation region than the remaining first pads arranged in positions opposite the second region are.

9 Claims, 21 Drawing Sheets

SEMICONDUCTOR DEVICE

CROSS-REFERENCE TO RELATED APPLICATIONS

The disclosure of Japanese Patent Application No. 2010-135855 filed on Jun. 15, 2010 including the specification, drawings and abstract is incorporated herein by reference in its entirety.

BACKGROUND

The present invention relates to semiconductor devices and in particular to a semiconductor device having pads.

As semiconductor integrated circuits are increasingly microminiaturized, the possibility that the following problem arises is increased: a problem that bonding wires electrically coupling a semiconductor device and an external circuit with each other are short-circuited. This is because the distance between adjacent wires is reduced and the possibility of contact between the adjacent wires is increased.

For example, in the semiconductor device disclosed in Japanese Unexamined Patent Publication No. Hei 6 (1994)-53266 (Patent Document 1), the following measure is taken: the interval between pads for bonding in proximity to the corner portions of a semiconductor chip is wider that the interval between pads for bonding in the other parts. Thus the occurrence of short-circuiting due to contact between wires is suppressed even though a wire is displaced by resin at a step of sealing a semiconductor chip with resin.

For example, in the semiconductor device described in Japanese Unexamined Patent Publication No. Hei 2 (1990)-130946 (Patent Document 2), the following measure is taken: a semiconductor chip and an external circuit are electrically coupled with each other by a protrusion for contact coupled to a pad for power supply in the center of the semiconductor chip. With this configuration, voltage drop is suppressed in an area where continuity is established between a pad for power supply and an external circuit.

[Patent Document 1]
Japanese Unexamined Patent Publication No. Hei 6 (1994)-53266

[Patent Document 2]
Japanese Unexamined Patent Publication No. Hei 2 (1990)-130946

SUMMARY

Semiconductor chips are formed by dicing a semiconductor wafer with semiconductor elements formed therein. Specifically, a semiconductor substrate is diced at peripheral regions (dicing line regions) arranged around element formation regions where multiple semiconductor elements are formed and thereby turned into semiconductor chips. In a dicing line region, there are formed a large number of TEGs (Test Element Groups) and pads for TEG. The TEGs and the pads for TEG are used, for example, to evaluate the characteristics of a semiconductor element formed in each element formation region.

When a semiconductor wafer is diced, the conductive material of TEGs and pads for TEG formed in each dicing line region flies off. As a result, pads for chip formed in an element formation region may be electrically short-circuited to each other.

Neither of the above patent documents gives consideration to short-circuiting between pads for chip due to fly-off of conductive material during dicing.

The prevent invention has been made in consideration of the above problem. It is an object thereof to provide a semiconductor device that makes it possible to suppress short-circuiting between pads for chip due to dicing processing.

A semiconductor device in an embodiment of the invention includes a semiconductor substrate, multiple first pads, and multiple second pads. The semiconductor substrate has a main surface and it further has in the main surface an element formation region and a dicing line region surrounding the element formation region. The first pads are formed in the element formation region. The second pads are formed in the dicing line region. The first pads and the second pads are respectively arranged in line along one side of the outer edge of the element formation region. The region where the second pads are arranged in line includes: a first region for which first pads are prone to be electrically short-circuited to each other; and a second region for which first pads are less prone to be electrically short-circuited to each other. Some of the first pads arranged in a position opposite the first region are arranged farther away from the one side than the remaining first pads of the first pads, arranged in a position opposite the second region.

A semiconductor device in another embodiment of the invention includes a semiconductor substrate, multiple first pads, and multiple second pads. The semiconductor substrate has a main surface and it further has in the main surface an element formation region and a dicing line region surrounding the element formation region. The first pads are formed in the element formation region. The second pads are formed in the dicing line region. The first pads and the second pads are respectively arranged in line along one side of the outer edge of the element formation region. The region where the second pads are arranged in line includes: a first region for which first pads are prone to be electrically short-circuited to each other; and a second region for which first pads are less prone to be electrically short-circuited to each other. Some of the first pads arranged in a position opposite the first region have a smaller planar shape than the remaining first pads of the first pads, arranged in a position opposite the second region.

A semiconductor device in a further another embodiment of the invention includes a semiconductor substrate, multiple first pads, and multiple second pads. The semiconductor substrate has a main surface and it further has in the main surface an element formation region and a dicing line region surrounding the element formation region. The first pads are formed in the element formation region. The second pads are formed in the dicing line region. The first pads and the second pads are respectively arranged in line along one side of the outer edge of the element formation region. The region where the second pads are arranged in line includes: a first region for which first pads are prone to be electrically short-circuited to each other; and a second region for which first pads are less prone to be electrically short-circuited. Some of the first pads arranged in a position opposite the first region are so arranged that they are located in multiple pad placement spots arranged with the same pitch as the following pitch: the arrangement pitch of the remaining first pads of the first pads, arranged in a position opposite the second region. At the same time, first pads are thinned out and a first pad is not placed at a predetermined pad placement spot.

A semiconductor device in a further another embodiment of the invention includes a semiconductor substrate, multiple first pads, and multiple second pads. The semiconductor substrate has a main surface and it further has in the main surface an element formation region and a dicing line region surrounding the element formation region. The first pads are formed in the element formation region. The second pads are formed in the dicing line region. The first pads and the second pads are respectively arranged in line along one side of the outer edge of the element formation region. The first pads arranged in line include: center pads arranged at the central part and end pads individually placed at both ends of the center pads. Each of the end pads has a larger planar shape than that of each of the center pads. The second pads are arranged in a position opposite the region where the center pads are arranged but a second pad is not placed in a position opposite the regions where the end pads are arranged.

A semiconductor device in a further another embodiment of the invention includes a semiconductor substrate, multiple first pads, and multiple second pads. The semiconductor substrate has a main surface and it further has in the main surface an element formation region and a dicing line region surrounding the element formation region. The first pads are formed in the element formation region. The second pads are formed in the dicing line region. The first pads and the second pads are respectively arranged in line along one side of the outer edge of the element formation region. The first pads arranged in line include: first center pads arranged at the central part and first end pads individually arranged at both ends of the first center pads. Each of the first end pads has a larger planar shape than that of each of the first center pads. The second pads include second center pads arranged in a position opposite the region where the first center pads are arranged and second end pads arranged in a position opposite the regions where the first end pads are arranged. The each of the second end pads has a smaller planar shape than that of each of the second center pads.

A semiconductor device in a further another embodiment of the invention includes a semiconductor substrate, multiple first pads, and multiple second pads. The semiconductor substrate has a main surface and it further has in the main surface an element formation region and a dicing line region surrounding the element formation region. The first pads are formed in the element formation region. The second pads are formed in the dicing line region. The first pads and the second pads are respectively arranged in line along one side of the outer edge of the element formation region. The first pads arranged in line include: first center pads arranged at the central part of the region where the first pads are arranged and first end pads individuality arranged at both ends of the first center pads. Each of the first end pads has a larger planar shape than that of each of the first center pads. With respect to the second pads, the pitch between second pads arranged between the central part of the region where the second pads are arranged and the end portions thereof is smaller than the pitch between second pads arranged on the central part side.

According to each embodiment of the invention, the following can be implemented even though a region where multiple second pads are arranged in line is cut by dicing: the arrangement of some of first pads arranged in a position opposite a first region for which first pads are prone to be electrically short-circuited is appropriate; therefore, electrical short-circuiting between first pads can be suppressed.

According to an embodiment of the invention, a second pad is not placed in a position opposite a region where an end pad is placed. For this reason, electrical short-circuiting can be suppressed between an end pad and a second pad.

According to an embodiment of the invention, each of second end pads has a smaller planar shape than that of each of second center pads. For this reason, electrical short-circuiting can be suppressed, for example, between a second end pad and a first end pad.

DETAILED DESCRIPTION

Hereafter, description will be given to embodiments of the invention with reference to the drawings.

First Embodiment

First, description will be given to semiconductor devices in the form of wafer as this embodiment.

Figure 1:
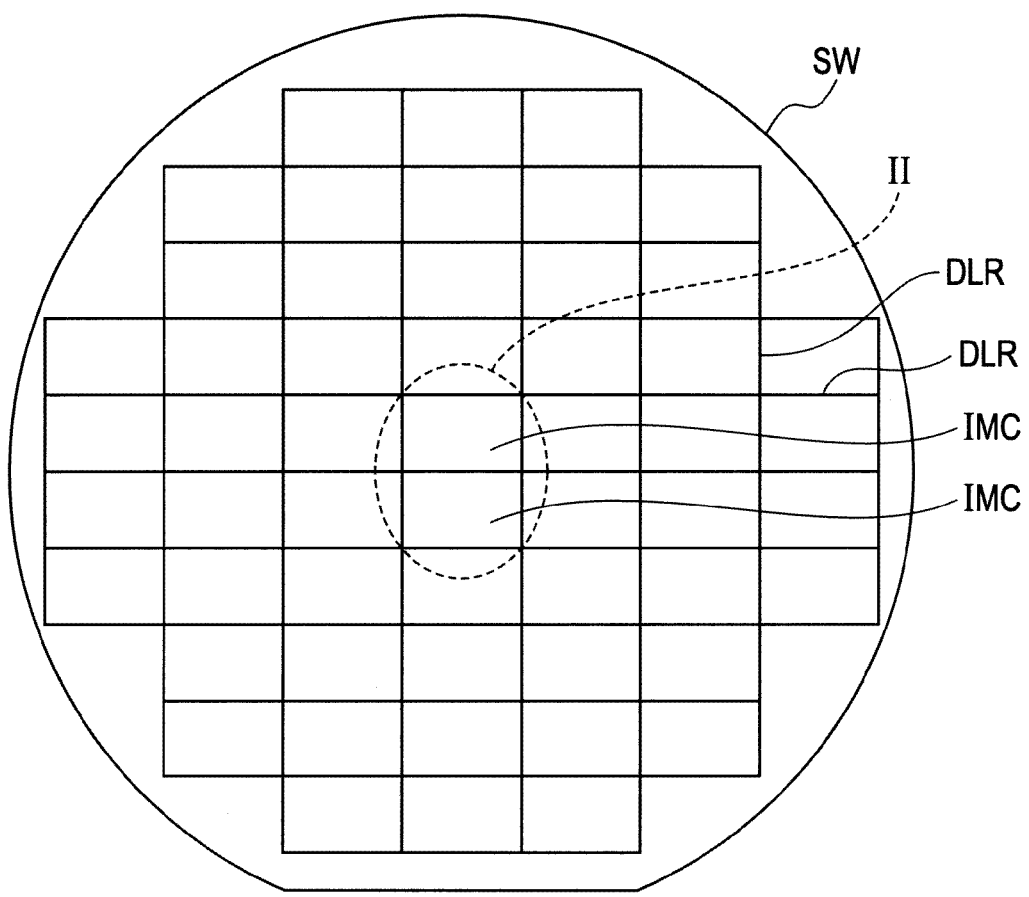
FIG. 1 is a schematic plan view illustrating the state of a wafer related to a semiconductor device in a first embodiment.
Figure 2:
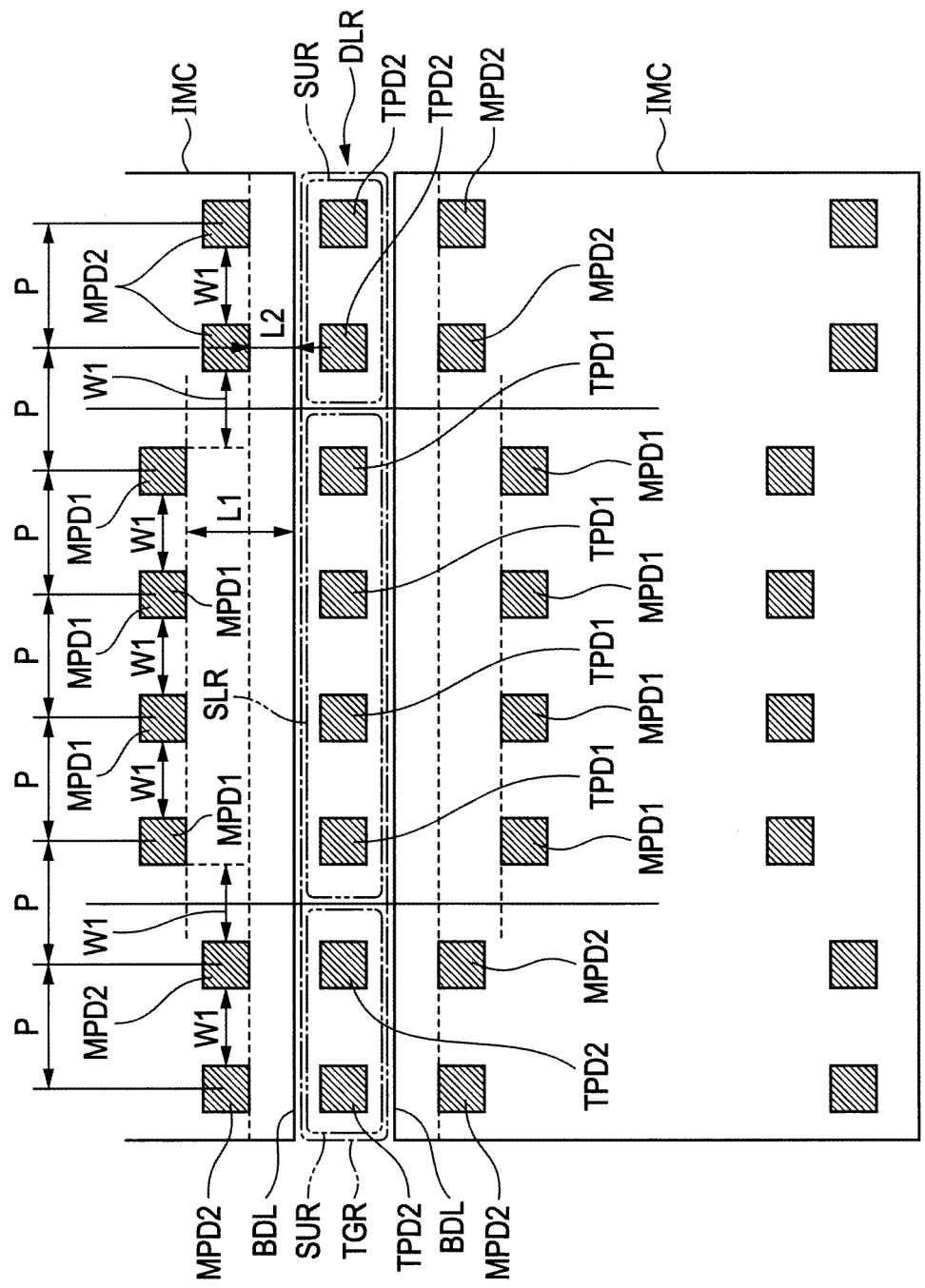
FIG. 2 is a schematic enlarged plan view of the area encircled with a circular broken line "II" in FIG. 1.

As illustrated in FIG. 1 and FIG. 2, for example, multiple chip regions (element formation regions) IMC and dicing line regions DLR are formed in the semiconductor wafer SW. The semiconductor wafer SW contains a semiconductor substrate formed of a semiconductor crystal of, for example, silicon. Each of the chip regions IMC has a rectangular planar shape and they are arranged in a matrix pattern. The area around each of the chip regions IMC is the dicing line region DLR. The chip regions IMC and the dicing line regions DLR are partitioned by a border line BDL.

As illustrated mainly in FIG. 2, multiple pads MPD1, MPD2 for chip (first pads) are formed in each of the chip regions IMC. The pads MPD1, MPD2 for chip are formed of metal material, such as aluminum or copper. In the example in FIG. 2, the chip region IMC has a square planar shape but the invention is not limited to this and the chip region can be formed in any shape, such as an oblong shape.

Each of the chip regions IMC includes a semiconductor element, such as MIS (Metal Insulator Semiconductor) transistor or diode, neither of which is shown in the drawing. The pads MPD1, MPD2 for chip are electrically coupled with the individual terminals of these semiconductor elements.

Multiple pads TPD1, TPD2 for TEG (second pads) are formed in each of the dicing line regions DLR. Similarly to the pads MPD1, MPD2 for chip, the pads TPD1, TPD2 for TEG are also formed of metal material, such as aluminum or copper.

Each of the pads MPD1, MPD2 for chip and the pads TPD1, TPD2 for TEG need not be in such a square planar shape as illustrated in FIG. 2 but they can be in any shape, for example, an oblong shape.

TEG, not shown, is formed in each of the dicing line regions DLR. The pads for TEG are electrically coupled with the terminals of these TEGs.

Each TEG formed in the dicing line region DLR is for evaluating the characteristics of, for example, semiconductor elements formed in the chip region IMC. The pads for TEG are used to couple a probe for evaluating the characteristics of each TEG formed in the dicing line region DLR.

In this embodiment, the pads MPD1, MPD2 for chip and the pads TPD1, TPD2 for TEG are all identical in size as viewed in a plane. The size of each of the pads MPD1, MPD2 for chip and the pads TPD1, TPD2 for TEG, cited here refers to the planar size of a portion of a conductive layer for pad exposed from a passivation film located in the uppermost layer. That pads are identical in size means that the pads are substantially identical in planar shape and dimensions.

The pads MPD1, MPD2 for chip and the pads TPD1, TPD2 for TEG are arranged in line along a border line (one side of the outer edge of each chip region IMC) BDL. Pads arranged in line cited here include not only pads the respective centers of which are arranged on a virtual straight line but also pads the respective centers of which are arranged off the virtual straight line.

A pad for TEG placement region TGR in which pads TPD1, TPD2 for TEG are arranged in line is formed in each dicing line region DLR. The pad for TEG placement region TGR includes: a region (first region) SLR for which pads for chip are prone to be electrically short-circuited and a region (second region) SUR for which pads for chip are less prone to be electrically short-circuited.

The pads TPD1 for TEG are placed in a region SLR for which short-circuiting is prone to occur and the pads TPD2 for TEG are placed in a region SUR for which short-circuiting is less prone to occur. The pads TPD1 for TEG and the pads TPD2 for TEG are so arranged that the following is implemented: they are identical in arrangement pitch P (intervals (pitch) between the central parts of the pads) and they are identical in arrangement distance W1 (shortest distance between pads).

The pads MPD1, MPD2 for chip arranged in line includes: pads MPD1 for chip (some first pads) so arranged that they are opposed to a region SLR for which short-circuiting is prone to occur (in the direction orthogonal to the border line BDL); and pads MPD2 for chip (the remaining first pads) so arranged that they are opposed to a region SUR for which short-circuiting is less prone to occur. The pads MPD1 for chip and the pads MPD2 for chip are so arranged that they are identical in arrangement pitch P and in arrangement distance W1.

However, the pads MPD1 for chip are arranged farther away from the border line BDL than the pads MPD2 for chip are. That is, the distance L1 between each of the pads MPD1 for chip and the border line BDL is longer than the distance L2 between each of the pads MPD2 for chip and the border line BDL. The distance cited here refers to a length taken in the direction orthogonal to the border line BDL. As a result, the interval between the pads MPD1 for chip and the pads TPD1 for TEG is longer than the interval between the pads MPD2 for chip and the pads TPD2 for TEG.

Description will be given to what regions a region SLR for which pads for chip are prone to be short-circuited and a region SUR for which they are less prone to be short-circuited concretely refer.

A region SLR for which short-circuiting is prone to occur refers to a region where a long wire or the like that can fly off toward a chip region IMC during dicing is formed. The reason for this is as described below. A region where a long wire or the like is formed is cut, part of the wire cut and flying off may arrive at a pad MPD for chip. This increases the possibility that pads MPD for chip are short-circuited to each other.

Specifically, the region SLR for which short-circuiting is prone to occur means any of the following regions: (1) a region where TEG (for example, transistor) having three or more terminals is formed; (2) a region where TEG (for example, diode) having two or less terminals is formed and there is a wire extended astride a pad for TEG; or (3) a region where TEG for wiring evaluation is formed.

Figure 7:
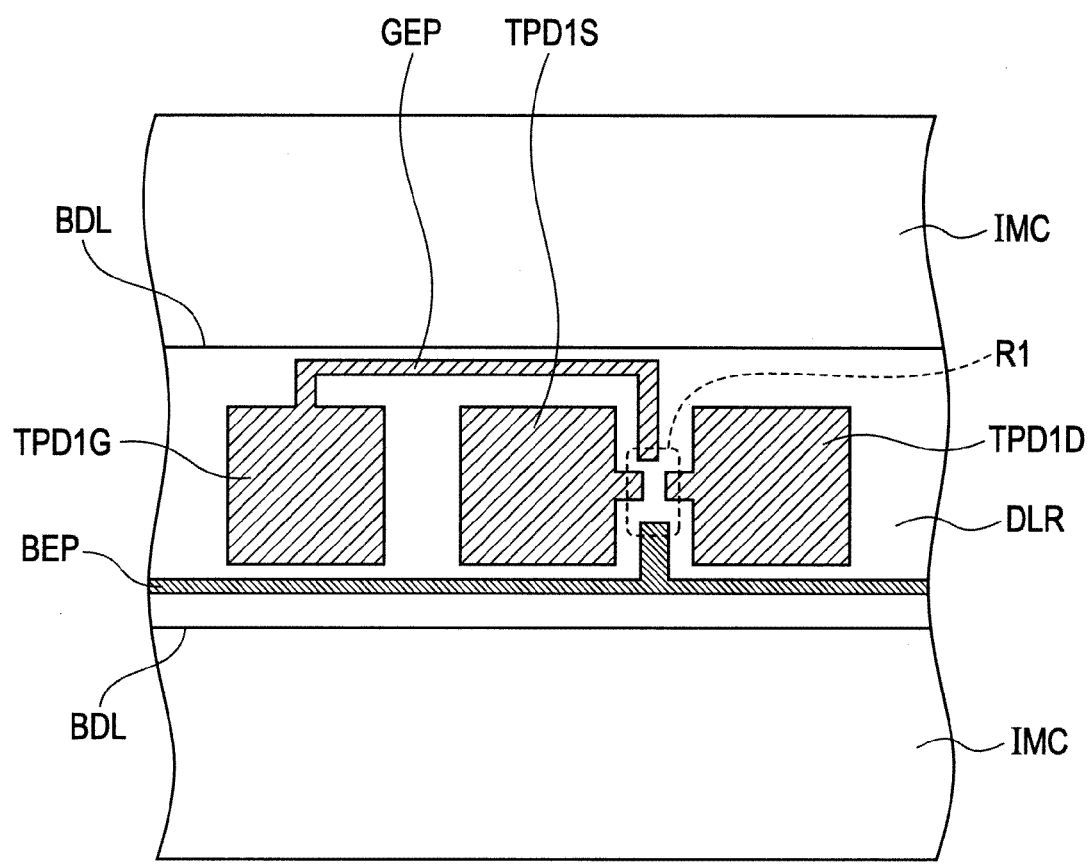
FIG. 7 is a schematic enlarged plan view illustrating an example of a region where short-circuiting is prone to occur in a dicing line region.

FIG. 7 illustrates a configuration in which, for example, a MIS transistor is formed as an element having three or more terminal as TEG. In case of such a MIS transistor as illustrated in FIG. 7, it is necessary to supply four potentials: source potential, drain potential, gate potential, and substrate potential. In accordance with this, for example, the following pads are arranged in a dicing line region DLR: a pad TPD1G for TEG electrically coupled to the gate; a pad TPD1S for TEG electrically coupled to the source; a pad TPD1D for TEG electrically coupled to the drain; and a pad for TEG (not shown) electrically coupled to the substrate. The MIS transistor is formed in, for example, the region R1 indicated by a broken line.

When the formation region R1 for the MIS transistor is positioned between pads TPD1S and TPD1D for TEG as mentioned above, it is necessary to take the following measure: a wire GEP extended from the gate of the MIS transistor to the pad TPD1G for TEG need be extended astride any other pad for TEG (for example, the pad TPD1S for TEG). For this reason, the wire GEP is routed for a long distance.

A wire BEP electrically coupled to the substrate in the MIS transistor formation region R1 also need be extended to a pad for TEG electrically coupled to the substrate. For this reason, this wire BEP also need be extended astride any other pad for TEG (for example, pads TPD1G, TPD1S, TPD1D for TEG) and it is routed for a long distance.

The region where the following are formed is a region for which short-circuiting is prone to occur: the formation region R1 for the MIS transistor, the pads TPD1G, TPD1S, TPD1D for TEG, the pads for TEG electrically coupled to the substrate, and the wires extended from the MIS transistor to the respective pads for TEG.

Figure 8:
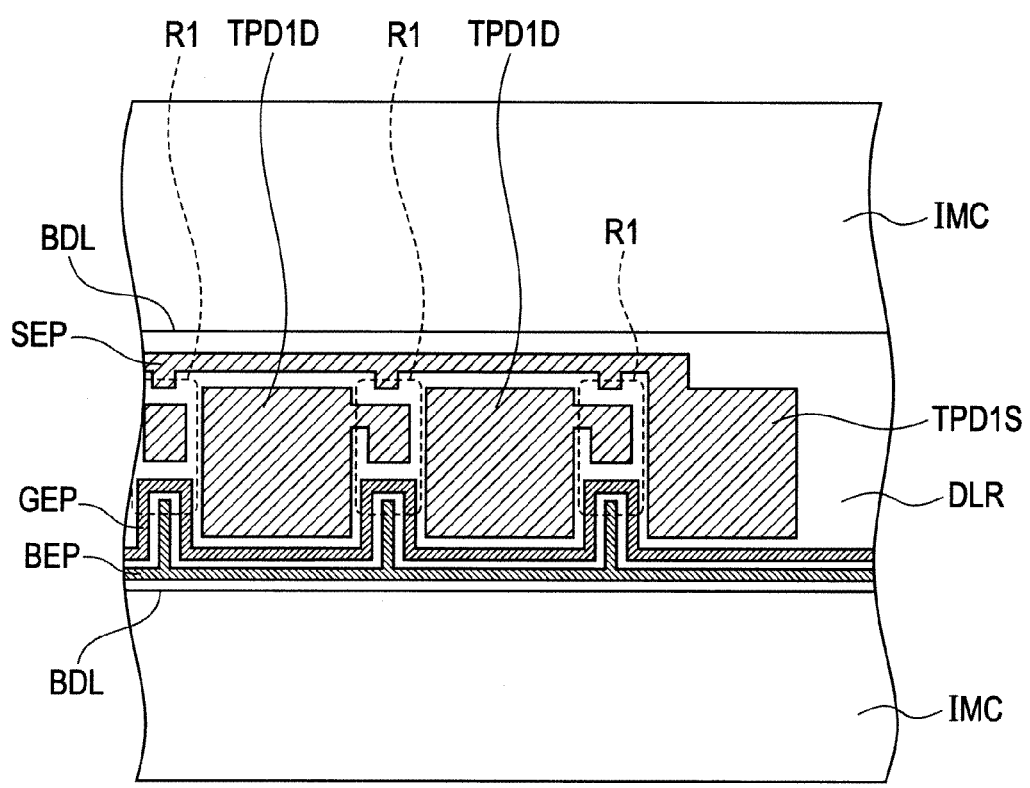
FIG. 8 is a schematic enlarged plan view illustrating another example, different from that in FIG. 7, of a region where short-circuiting is prone to occur in a dicing line region.
Figure 9:
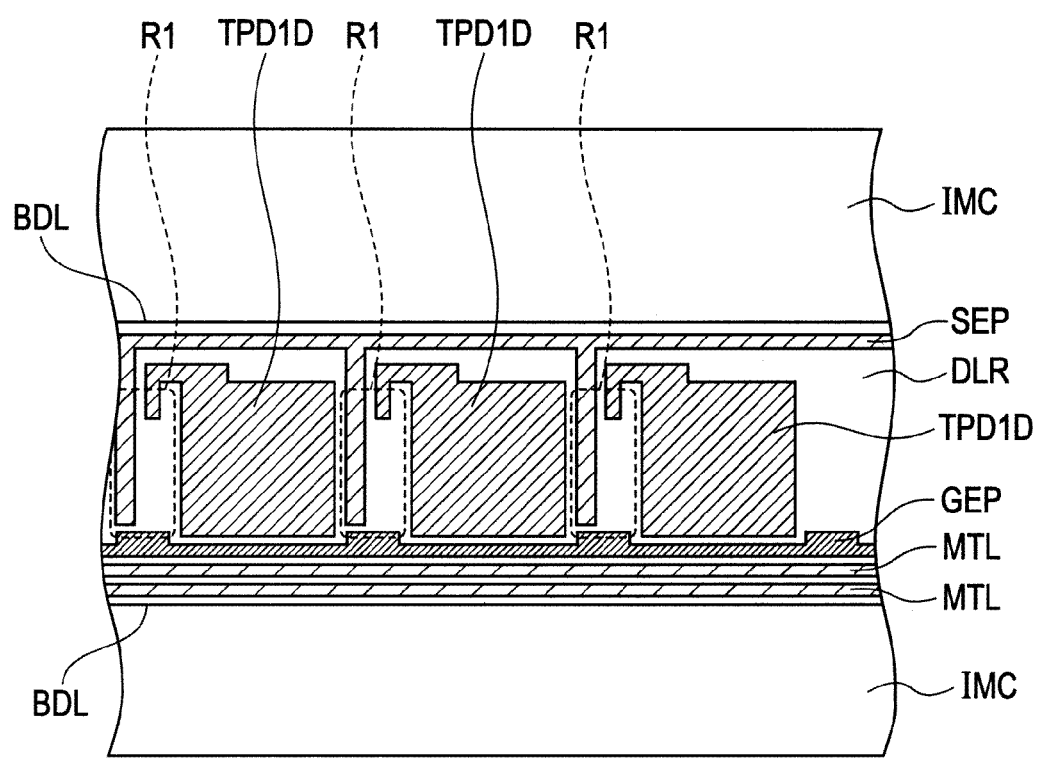
FIG. 9 is a schematic enlarged plan view illustrating another example, different from that in FIG. 8, of a region where short-circuiting is prone to occur in a dicing line region.

FIG. 8 and FIG. 9 also show a configuration in which a MIS transistor is formed as an element having three or more terminals as TEG. In the example in FIG. 8, a source wire SEP, a gate wire GEP, and a substrate wire BEP are shared among multiple MIS transistors. For this reason, each of the source wire SEP, gate wire GEP, and substrate wire BEP need be extended astride any other pad for TEG (for example, pads TPD1S, TPD1D for TEG) and they are routed for a long distance. In the configuration in FIG. 8, the region where the following are placed is a region for which short-circuiting is prone to occur: the formation regions R1 for the MIS transistors, the pads TPD1D, TPD1S for TEG, the pad for TEG electrically coupled to the gate, the pad for TEG electrically coupled to the substrate, and the wires extended from the MIS transistors to the respective pads for TEG.

In the example in FIG. 9, a source wire SEP and a gate wire GEP are shared among multiple MIS transistors. Other wires MTL are also routed. For this reason, it is necessary to extend each of the source wire SEP, gate wire GEP, and other wires MTL astride any other pad for TEG (for example, the pad TPD1D for TEG) and they are routed for a long distance. In this configuration in FIG. 9, the region where the following are placed is a region for which short-circuiting is prone to occur: the formation regions R1 for the MIS transistors, the pads TPD1D for TEG, the pad for TEG electrically coupled to the source, the pad for TEG electrically coupled to the gate, the pad for TEG electrically coupled to the substrate, the wires extended from the MIS transistors to the respective pads for TEG, and the other wires MTL.

Figure 10:
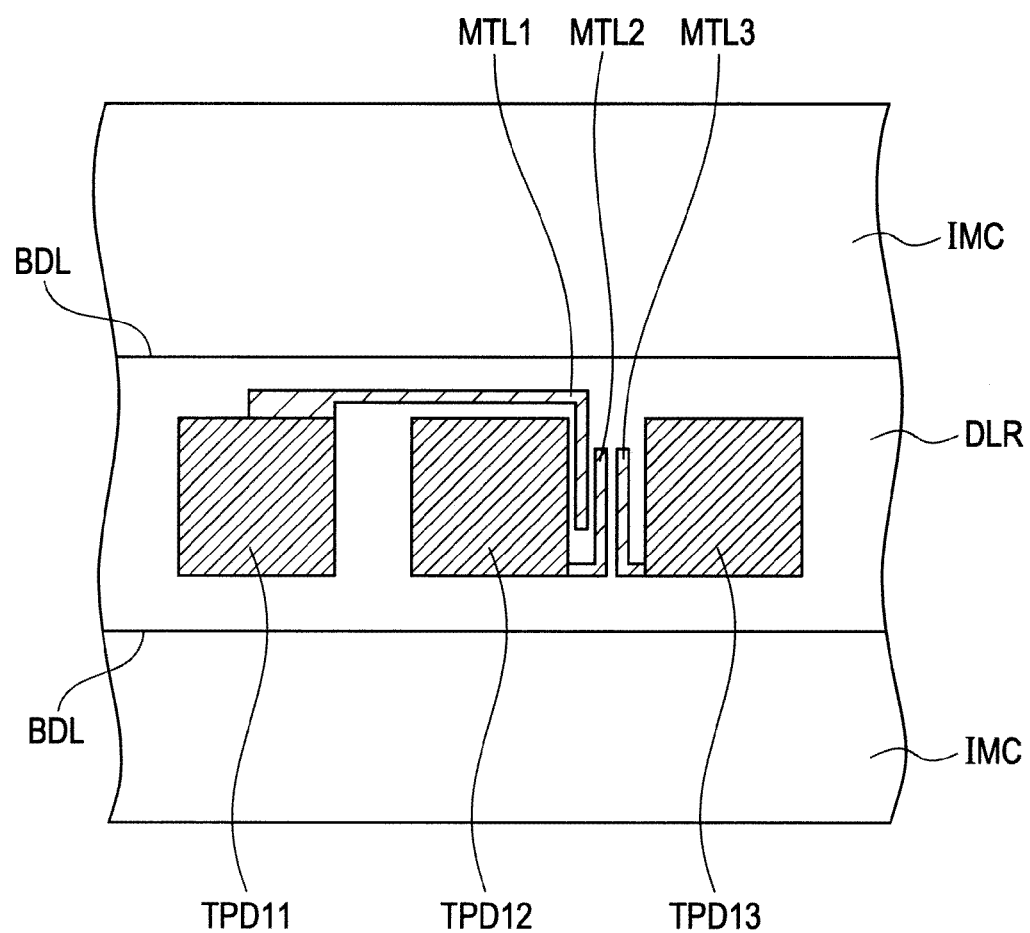
FIG. 10 is a schematic enlarged plan view illustrating another example, different from that in FIG. 9, of a region where short-circuiting is prone to occur in a dicing line region.

FIG. 10 illustrates a configuration obtained when TEG for wiring evaluation for evaluating short-circuiting between wires is formed. In the example in FIG. 10, three wires MTL1 to MTL3 are so arranged that they run in parallel with one another between pads TPD12 and TPD13 for TEG. The wire MTL1 is electrically coupled to a pad TPD11 for TEG; the wire MTL2 is electrically coupled to the pad TPD12 for TEG; and the wire MTL3 is electrically coupled to the pad TPD13 for TEG. Especially, the wire MTL1 need be extended astride the pad TPD12 for TEG and it is routed for a long distance. In the configuration in FIG. 10, the region where the three wires MTL1 to MTL3 and the pads TPD11 to TPD13 for TEG are arranged is a region for which short-circuiting is prone to occur.

With the TEGs for wiring evaluation illustrated in FIG. 10, it can be evaluated whether or not wires are short-circuited to each other according because of the presence of conductive foreign matter between the wires MTL1 to MTL3 running in parallel with one another.

In FIG. 8 to FIG. 10, elements corresponding to those in FIG. 7 are marked with the same reference codes. The region SUR for which short-circuiting is less prone to occur is a region having a configuration different from that of TEGs formed in the above regions SLR for which short-circuiting is prone to occur. That is, the region SUR for which short-circuiting is less prone to occur refers to a region where there is not TEG for wiring evaluation or TEG having a wire extended astride a pad for TEG.

With reference to FIG. 2, description has been given to a case where the multiple pads MPD1, MPD2 for chip arranged in line are identical in arrangement pitch P. However, the arrangement pitch of the pads for chip arranged in line may differ. In this case, it is desirable that the arrangement pitch P2 of the pads MPD1 for chip opposite the region SLR for which short-circuiting is prone to occur should be made larger than the following pitch as illustrated in, for example, FIG. 3: the arrangement pitch P1 of the pads MPD2 for chip opposite the region SUR for which short-circuiting is less prone to occur. In this case, since each of the pads MPD1, MPD2 for chip is identical in size, the interval W2 between the pads MPD1 for chip is longer than the interval W1 between the pads MPD2 for chip. The pads for TEG are arranged with a certain arrangement pitch P3 and at certain intervals W3 together with the pads TPD1 for TEG and the pads TPD2 for TEG.

Figure 3:
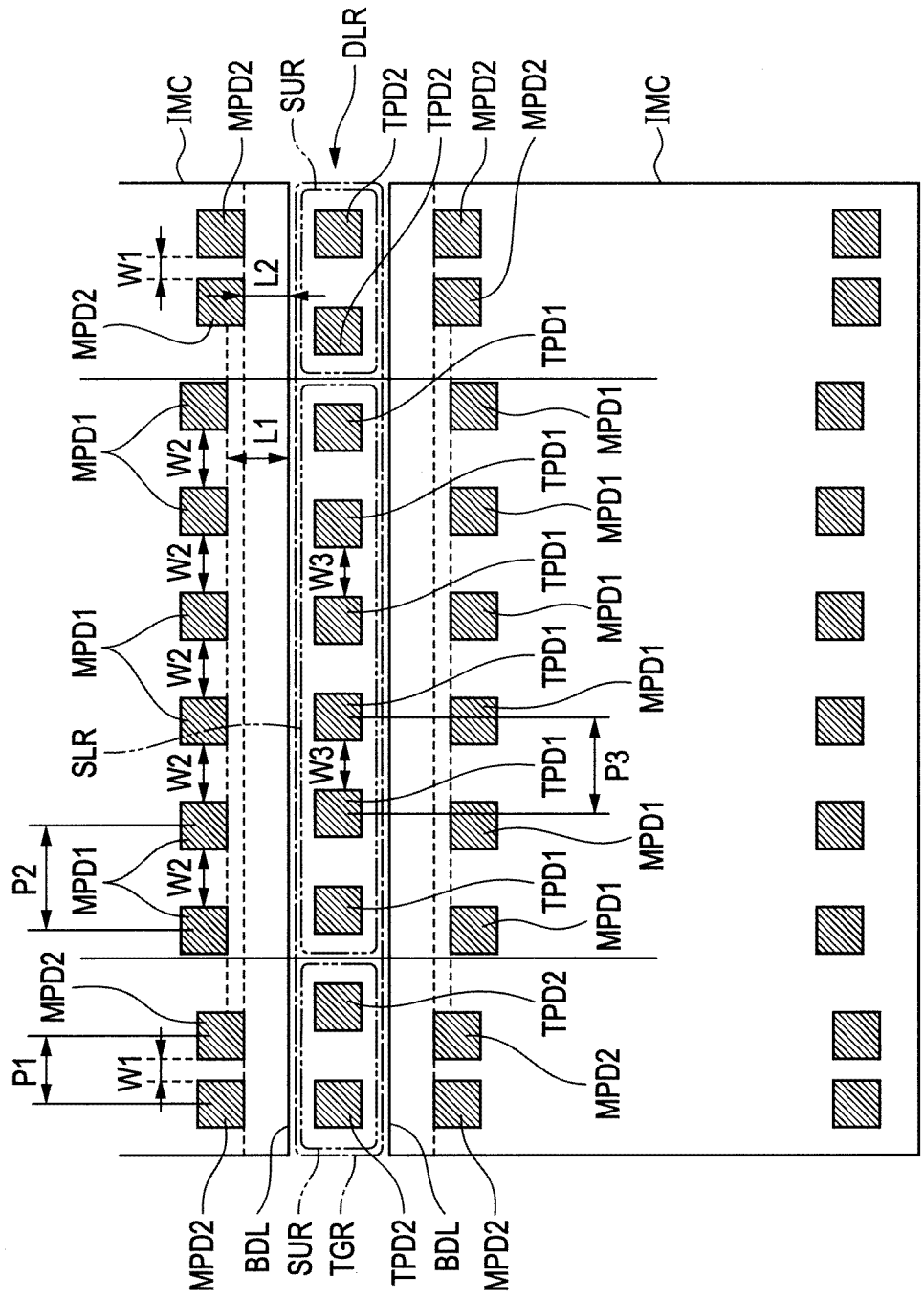
FIG. 3 is a schematic enlarged plan view illustrating a modification to the arrangement of pads in a semiconductor device in the first embodiment.

The other configuration elements in FIG. 3 are basically the same as those in FIG. 2 except the number of pads shown in the drawing and the like. Therefore, of the elements in FIG. 3, those identical with the elements in FIG. 2 will be marked with the same reference codes and the description thereof will not be repeated. The values of dimensions of P1, W1, P2, and the like in different drawings, for example, FIG. 2 and FIG. 3, are independent of one another.

Figure 6:
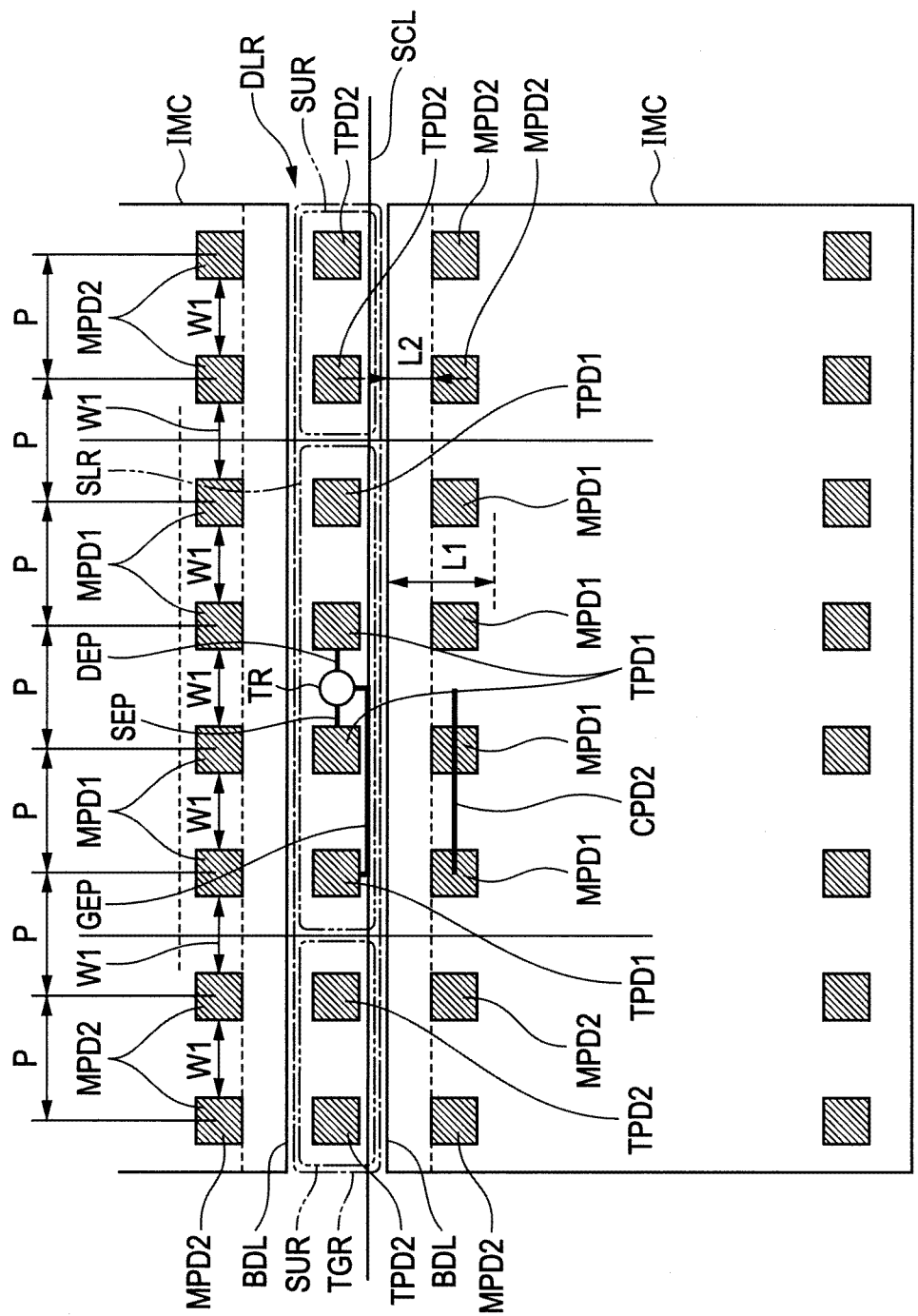
FIG. 6 is a schematic enlarged plan view illustrating a state in which a wire fall into a region where pads for chip are formed due to conventional dicing for semiconductor devices.

Description will be given to the action and effect of a semiconductor device in this embodiment in contrast with a comparative example (FIG. 6).

Figure 4:
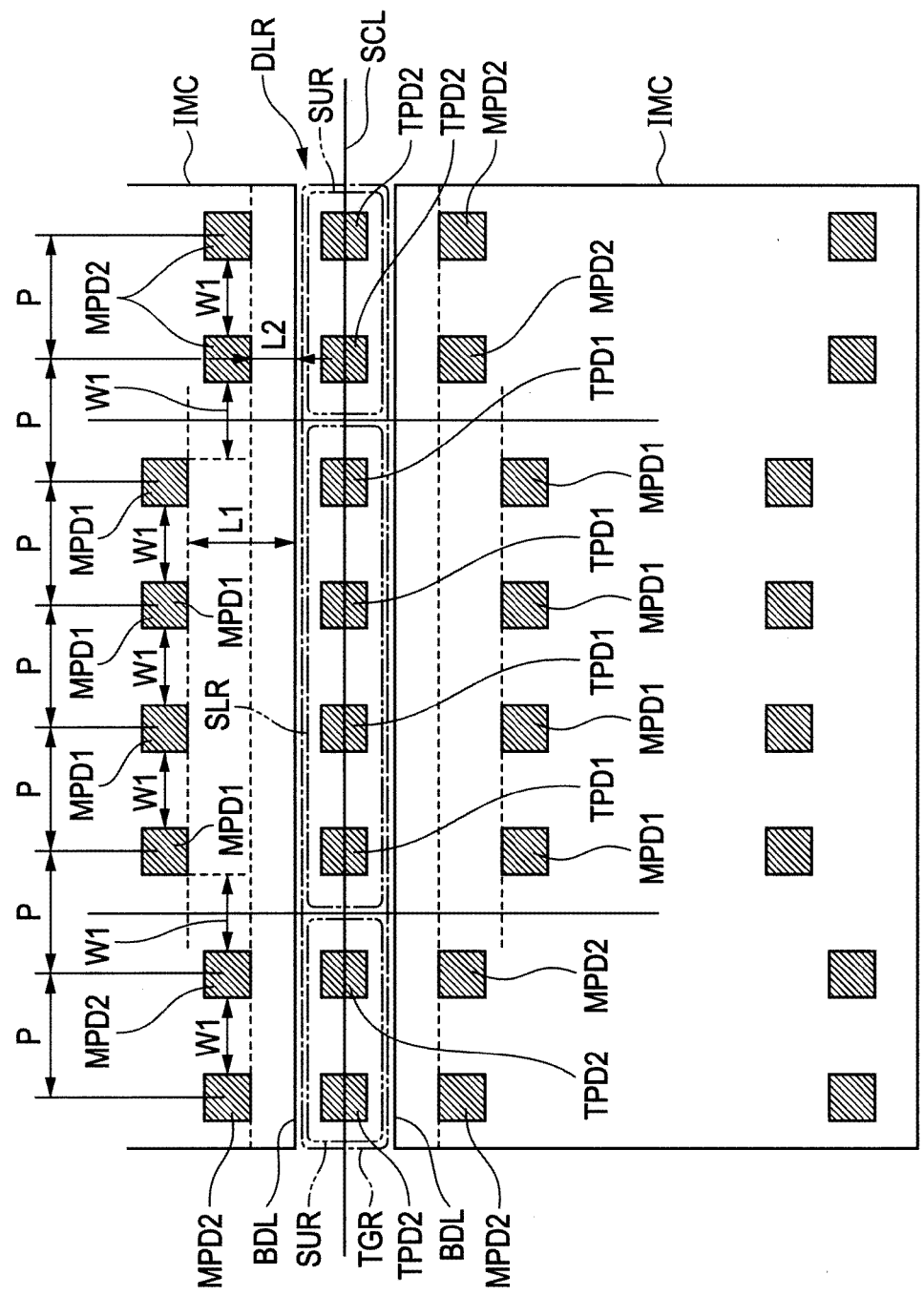
FIG. 4 is a schematic enlarged plan view illustrating a mode of dicing in the area shown in FIG. 2.

A semiconductor wafer SW having, for example, such arrangement of pads for chip and pads for TEG as illustrated in FIG. 2 is cut at dicing line regions DLR. At this time, a cutting line SCL is laid on, for example, the pads TPD1, TPD2 for TEG (so that the pads TPD1, TPD2 for TEG are cut) as illustrated in FIG. 4.

Figure 5:
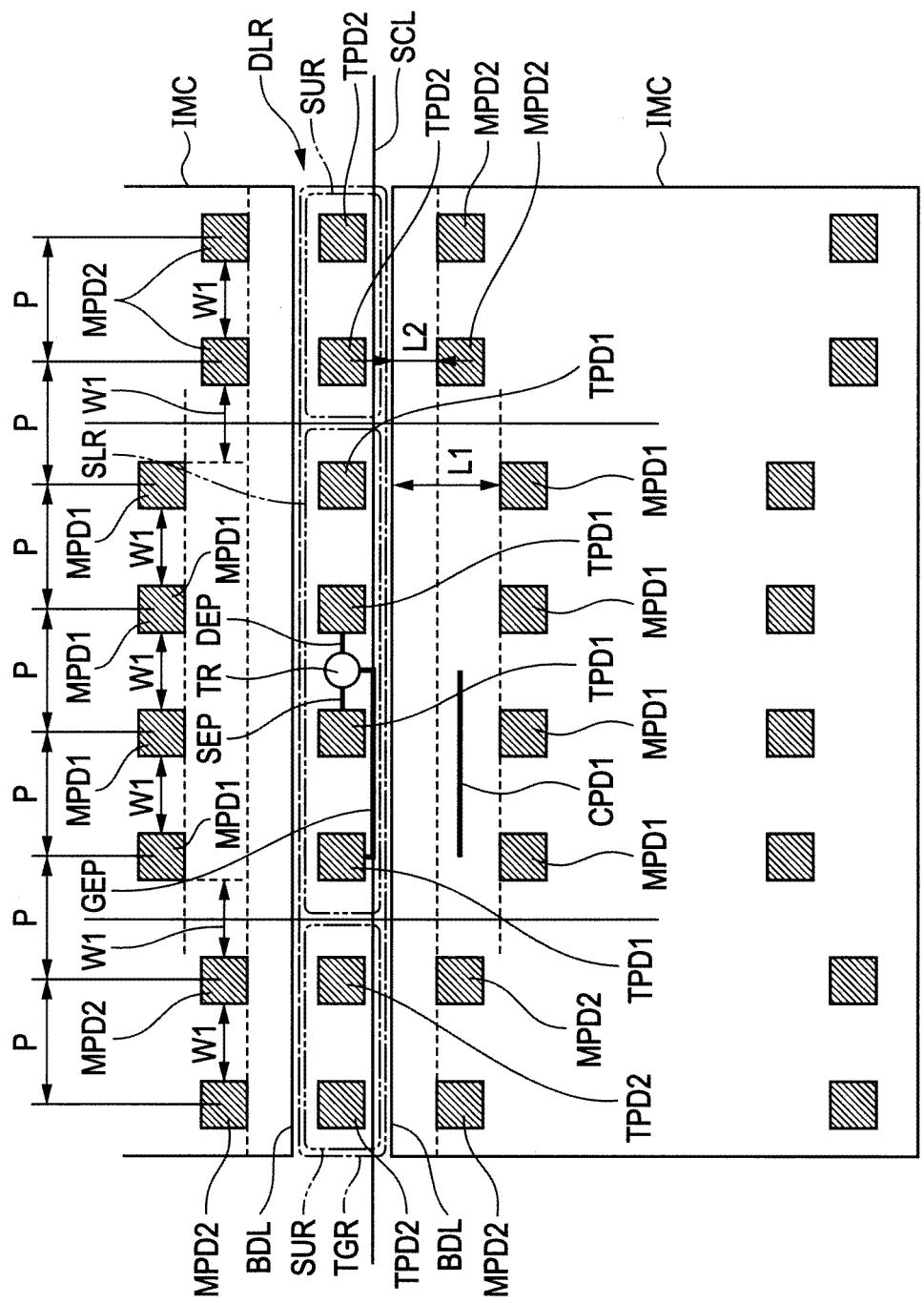
FIG. 5 is a schematic enlarged plan view illustrating a state in which a wire fell into a region where pads for chip are formed due to dicing in the area shown in FIG. 2.

On the dicing line region DLR, as illustrated in FIG. 5, for example, a MIS transistor TR and the like are formed in addition to the pads TPD1, TPD2 for TEG as mentioned above. From the MIS transistor TR, a gate wire GEP, a source wire SEP, a drain wire DEP, and the like are extended.

The semiconductor wafer SW is diced at the dicing line regions DLR; however, an error is produced in positional accuracy in dicing. Specifically, as illustrated in, for example, FIG. 5, the cutting line SCL may be located in an area away from the central part between opposite border lines BDL (close to either border line BDL).

If the cutting line SCL is located in a position on the gate wire GEP at this time, a chipping wire CPD1, a broken piece produced when the gate wire GEP is cut, may fly off into a chip region IMC. If this chipping wire CPD1 is placed astride, for example, adjacent pads MPD1 for chip, the pads MPD for chip are short-circuited to each other.

The semiconductor wafer in the comparative example in FIG. 6 is different from the semiconductor wafer in this embodiment in that: all the pads MPD1, MPD2 for chip are so arranged that the distance between each of them and the border line BDL is L2. When the dicing line region DLR is cut by dicing in this state, the gate wire GEP is cut and resulting broken pieces fly off into the chip region IMC. Consideration will be given to this case.

If the chipping wire CPD2 as a broken piece of the gate wire GEP flies off into an area at a distance of not less than L2 and less than L1 from the border line BDL of the chip region IMC, the following may take place: the chipping wire CPD2 may be placed astride two adjacent pads MPD1 for chip. Thus the chipping wire CPD2 short-circuits the two adjacent pads MPD1 for chip to each other.

Meanwhile, in the semiconductor wafer in this embodiment in FIG. 5, a chipping wire CPD1 of the same length that flies off to the same position as in the semiconductor wafer in FIG. 6 does not fall down onto pads MPD1 for chip. This is because the pads MPD1 for chip opposite the region SLR for which short-circuiting is prone to occur are formed in the following region: a region farther away from the border line BDL (at a distance of longer than L2 from the border line BDL) than the pads MPD2 for chip opposite the region SUR for which short-circuiting is less prone to occur are. Therefore, the occurrence of short-circuiting caused by the chipping wire CPD1 can be suppressed by arranging the pads MPD1 for chip as in this embodiment.

However, the distance between the pads MPD2 for chip opposite the region SUR for which short-circuiting is less prone to occur and the border line BDL is set to L2 (<L1). If the distance of every pad for chip from the border line BDL is set to as large a value as L1, the ratio of the area of regions required for the arrangement of pads in the chip region IMC is increased. As a result, the ratio of the area of regions required for the arrangement of semiconductor elements in the chip region IMC is reduced. For this reason, there is the possibility that the degree of integration of semiconductor elements formed in the chip region IMC is reduced. Since the pads MPD2 for chip are arranged closer to the border line BDL than the pads MPD1 for chip are in this embodiment, the degree of integration of semiconductor elements in the chip region IMC can be enhanced.

As illustrated in FIG. 3, the arrangement pitch P1 between the pads MPD2 for chip is smaller than the arrangement pitch P2 between the pads MPD1 for chip. Therefore, it is possible to reduce the size of the planar shape of the chip region IMC or increase the number of pads placed in the chip region IMC.

Second Embodiment

This embodiment is different from the first embodiment in the configuration of the pads for chip. Hereafter, description will be given to a semiconductor device in this embodiment.

Figure 11:
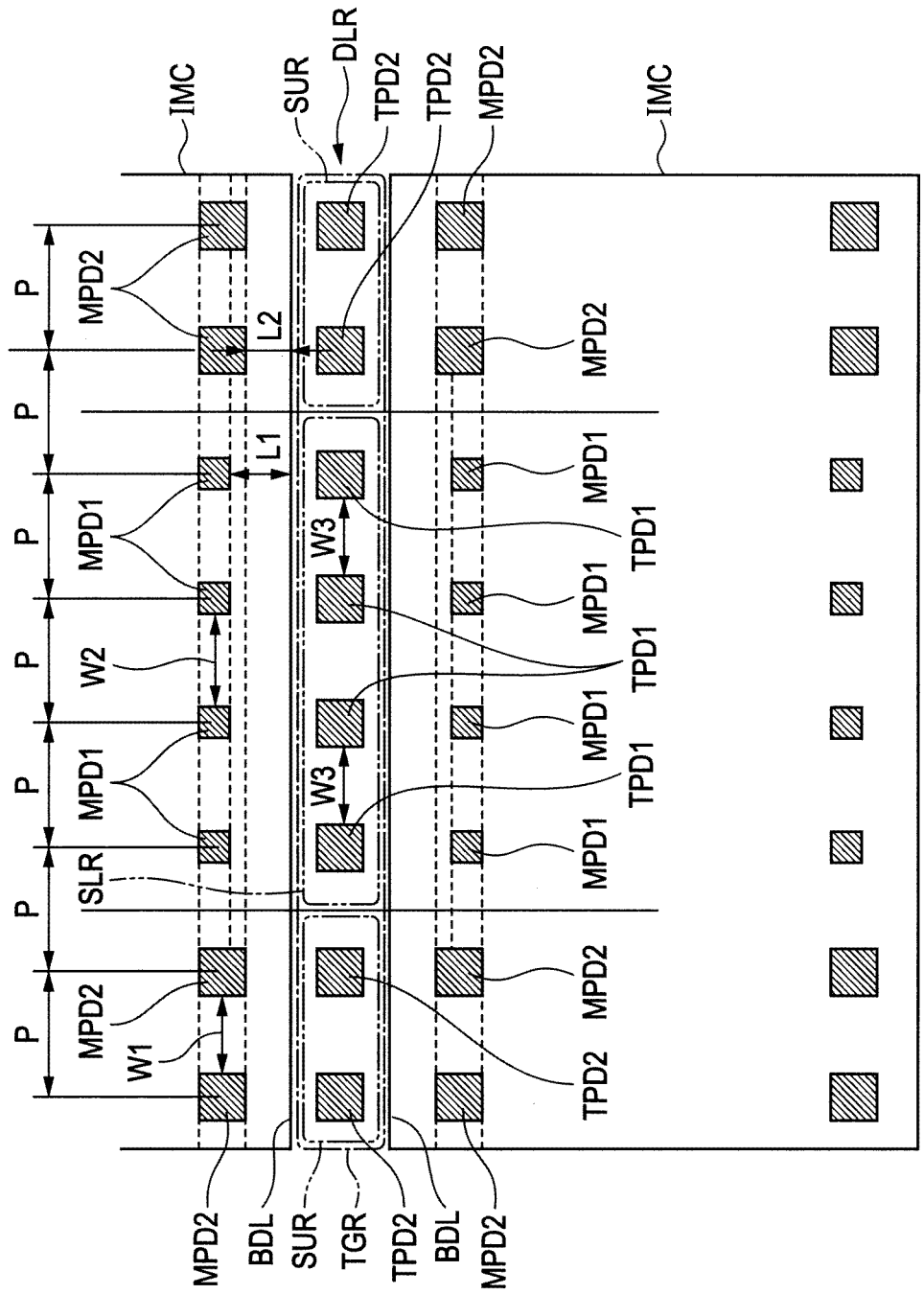
FIG. 11 is a schematic enlarged plan view of a semiconductor device in a second embodiment, similar to FIG. 2.
Figure 12:
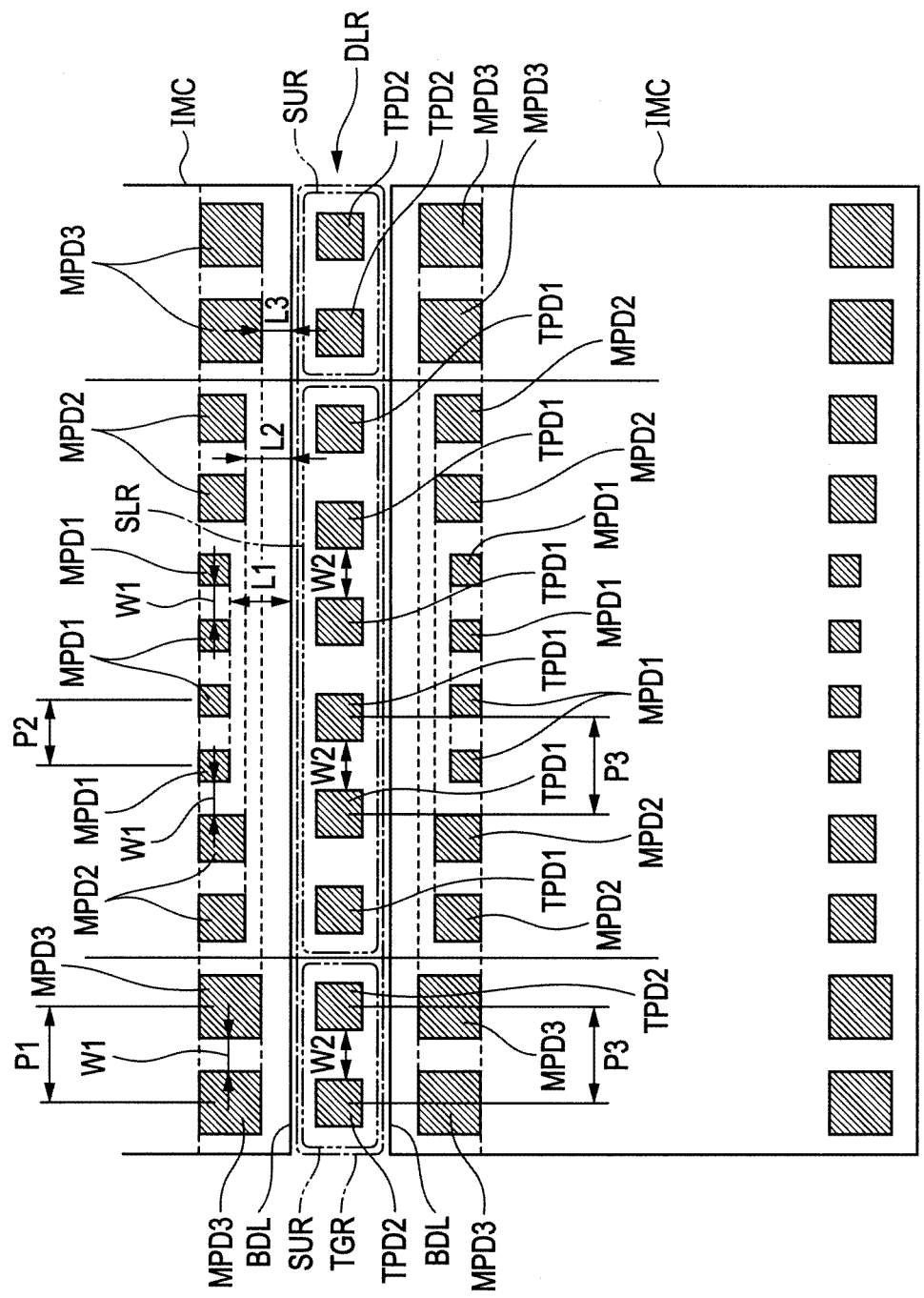
FIG. 12 is a schematic enlarged plan view illustrating a modification to the arrangement of pads in a semiconductor device in the second embodiment.

In a semiconductor device in this embodiment, the measure illustrated in FIG. 11 and FIG. 12 is taken. That is, the size of each of pads MPD1 for chip (some first pads) opposite the region SLR for which short-circuiting is prone to occur in the dicing line region DLR as viewed in a plane is smaller than the following: the size of each of pads MPD2 for chip (the remaining first pads) opposite the region SUR for which short-circuiting is less prone to occur.

It is desirable that the pads MPD1 for chip smaller in planar shape should be so formed that the positions in them farthest away from the border line BDL are aligned with the pads MPD2 for chip in an ordinary size. The pads MPD2 for chip are identical in size with, for example, the pads MPD1, MPD2 for chip in the first embodiment. That is, it is desirable that the straight line coupling the following positions should be formed substantially in parallel with the border line BDL: the position in each of the pads MPD1 for chip farthest away from the border line BDL and the position in each of the pads MPD2 for chip farthest away from the border line BDL. In this case, the distance L1 between each of the pads MPD1 for chip and the border line BDL is longer than the distance L2 between each of the pads MPD2 for chip and the border line BDL.

In the semiconductor device in FIG. 11, the pads MPD1, MPD2 for chip and the pads TPD1, TPD2 for TEG are all arranged with an identical arrangement pitch P. However, since the pads MPD1 for chip and the pads MPD2 for chip are different from each other in size, the intervals between adjacent pads are different. Specifically, the interval W2 between the pads MPD1 for chip is longer than the interval W1 between the pads MPD2 for chip. In the configuration in FIG. 11, all the pads for TEG are identical in size, arrangement pitch P, and interval W3.

In the semiconductor device in FIG. 12, three different types of pads MPD1, MPD2, MPD3 for chip different in size are formed. As viewed in a plane, the size of each of the pads MPD1 for chip opposite the region SLR for which short-circuiting is prone to occur is smallest, followed by that of each of the pads MPD2 for chip. The pads MPD3 for chip opposite the region SUR for which short-circuiting is less prone to occur are largest. The intervals between these pads for chip of all the types are equally W1. Meanwhile, the arrangement pitch P2 between the pads MPD1 for chip is smaller than the arrangement pitch P1 between the pads MPD3 for chip. Also in the semiconductor device in FIG. 12, all the pads for TEG are identical in size, arrangement pitch P3, and interval W2.

The position in each of the pads MPD1 for chip farthest away from the border line BDL is aligned with the following positions: the position in each of the pads MPD2 for chip farthest from the border line BDL and the position in each of the pads MPD3 for chip farthest from the border line BDL. For this reason, the distance L1 between each of the pads MPD1 for chip and the border line BDL is longer than the distance L2 between each of the pads MPD2 for chip and the border line BDL. This distance L2 is longer than the distance L3 between each of the pads MPD3 for chip and the border line BDL.

In the examples in FIG. 11 and FIG. 12, the elements other than the foregoing are substantially the same as those in the semiconductor device in the first embodiment. In the description of this embodiment, therefore, the same elements as in the first embodiment will be marked with the same reference codes and the description thereof will not be repeated. For example, the material of the pads MPD3 for chip is the same as the material of the pads MPD1, MPD2 for chip in the first embodiment.

Description will be given to the action and effect of this embodiment. In the semiconductor device in this embodiment illustrated in FIG. 11, the distance L1 between each of the pads MPD1 for chip and the border line BDL is longer than the following distance: the distance L2 between each of the pads MPD2 for chip and the border line BDL. That is, similarly to the semiconductor device in the first embodiment, the distance L1 between each of the pads MPD1 for chip opposite the region SLR for which short-circuiting is prone to occur and the border line BDL is longer than the following distance: the distance L2 between each of the pads MPD2 for chip opposite the region SUR for which short-circuiting is less prone to occur and the border line BDL. As a result, the interval between the pads MPD1 for chip and the pads TPD1 for TEG in the direction perpendicular to the border line BDL is longer than the following interval: the interval between the pads MPD2 for chip and the pads TPD2 for TEG in the direction perpendicular to the border line BDL.

Also in this embodiment, for this reason, the following problem can be suppressed as in the semiconductor device in the first embodiment: a problem that a chipping wire CPD2 (Refer to FIG. 6) short-circuits pads for chip to each other when the dicing line region DLR is cut.

Similarly, a measure is taken in the semiconductor device in a modification illustrated in FIG. 12 so that the following is implemented: the distance L1 between each of the pads MPD1 for chip and the border line BDL is longest, followed by the distance L2 between each of the pads MPD2 for chip and the border line BDL. The distance L3 between each of the pads MPD3 for chip and the border line BDL is shortest. That is, the distance between each of the pads for chip opposite the region SLR for which short-circuiting is prone to occur and the border line BDL is increased. Specifically, the distance between the pads MPD1 for chip and the pads TPD1 for TEG is longer than the distance between the pads MPD3 for chip and the pads TPD2 for TEG. For this reason, a problem that pads for chip are short-circuited to each other can be suppressed as in the semiconductor device in FIG. 11.

In the configuration in FIG. 11, the arrangement pitch P of the pads MPD1 for chip and the arrangement pitch P of the pads MPD2 for chip are identical with each other; and the size of each of the pads MPD1 for chip is smaller than the size of each of the pads MPD2 for chip. For this reason, the interval W2 between the pads MPD1 for chip is longer than the interval W1 between the pads MPD2 for chip. This makes it possible to further suppress short-circuiting between pads MPD1 for chip.

In the configuration in FIG. 12, the interval W1 between the pads MPD1 for chip and the interval W1 between the pads MPD3 for chip are identical with each other. This makes it possible to reduce the planar shape of the chip region IMC or increase the number of pads MPD1 to MPD3 for chip arranged in the chip region IMC.

In the configuration in FIG. 12, each of the pads MPD1 for chip and each of the pads MPD2 for chip opposite the region SLR for which short-circuiting is prone to occur are different in size. This makes it possible to change the size of pads in chip according to the proneness of short-circuiting and the degree of freedom in designing is enhanced.

Figure 13:
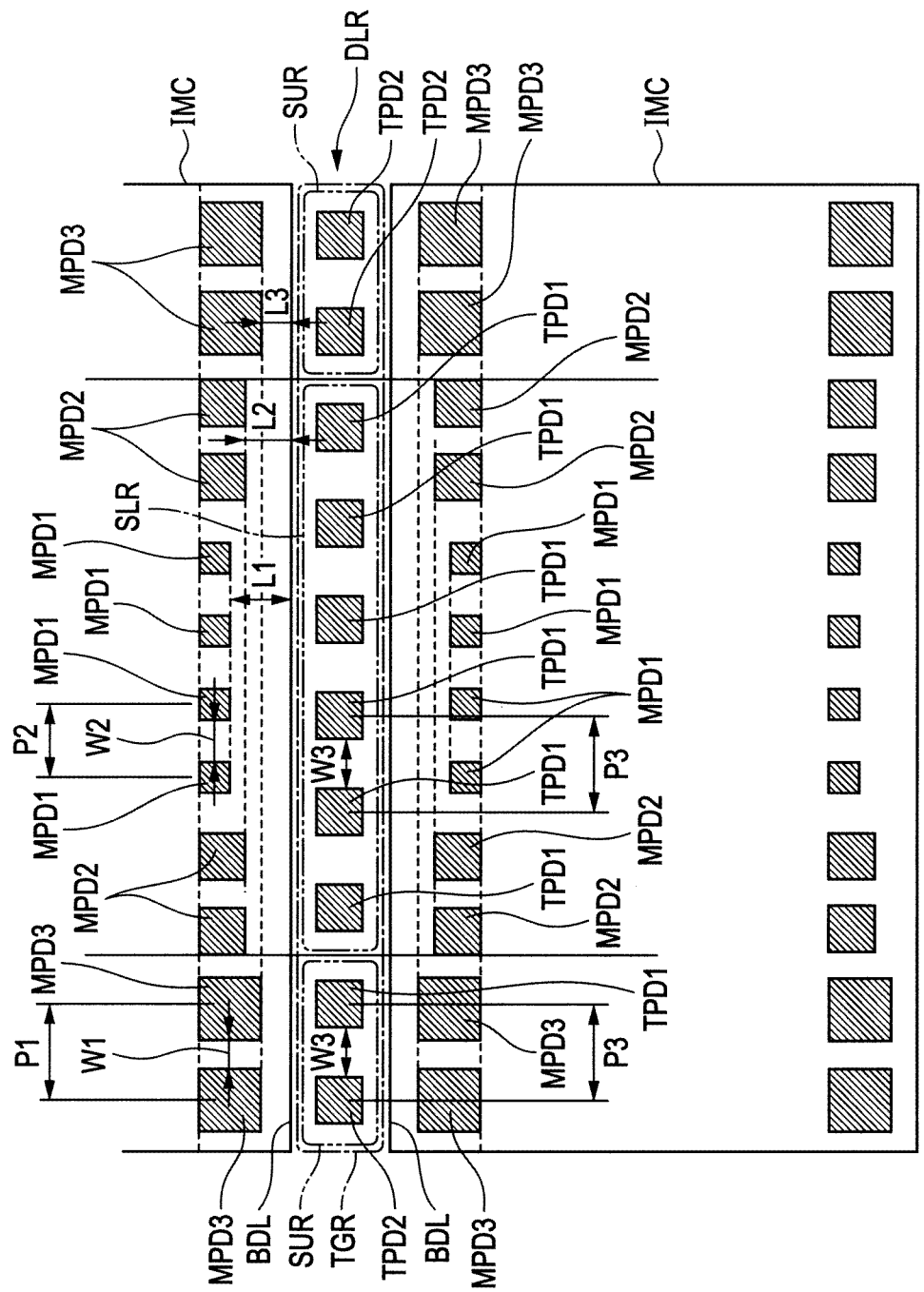
FIG. 13 is a schematic enlarged plan view illustrating a modification, different from that in FIG. 12, to the arrangement of pads in a semiconductor device in the second embodiment.

In the description of the configuration in FIG. 12, a case where the interval W1 between pads MPD1 for chip and the interval W1 between pads MPD3 for chip are identical has been taken as an example. As illustrated in FIG. 13, however, the interval W2 between pads MPD1 for chip may differ from the interval W1 between pads MPD3 for chip. In the example in FIG. 13, the interval W2 between pads MPD1 for chip is longer than the interval W1 between pads MPD3 for chip. The interval between pads MPD2 for chip and the interval between the pads MPD1 for chip and the pads MPD2 for chip are also longer than the interval W1 between pads MPD2 for chip. This makes it possible to further suppress short-circuiting between pads MPD1 for chip.

In the configurations in FIG. 11 to FIG. 13, the size of each of the pads for chip opposite the region SUR for which short-circuiting is less prone to occur is larger than the following size: the size of each of the pads for chip opposite the region SLR for which short-circuiting is prone to occur. Further, the pads for chip opposite the region SLR for which short-circuiting is prone to occur are arranged in the region corresponding to the central part of the border line BDL; and the pads for chip opposite the region SUR for which short-circuiting is less prone to occur are arranged in the regions corresponding to the ends of the border line BDL. To the pads for chip arranged in the regions corresponding to the ends of the border line BDL, usually, a bonding wire is bonded at an angle largely inclined from the direction orthogonal to the border line BDL. This is because the arrangement pitch of the inner lead portions corresponding to the pads for chip is larger than the arrangement pitch of the pads for chip.

When a bonding wire is bonded at an angle largely inclined from the border line BDL as viewed in a plane as mentioned above, the following takes place: if the planar shape of each of the pads for chip is small, it is difficult to bond a bonding wire to the pad for chip. In the configurations in FIG. 11 to FIG. 13, meanwhile, the above-mentioned measure is taken. That is, the size of each of the pads for chip arranged in the regions corresponding to the ends of the border line BDL (the pads for chip opposite the region SUR for which short-circuiting is less prone to occur) is larger than the following size: the size of each of the other pads for chip. For this reason, the above bonding of bonding wires is facilitated and the bond is more reliable.

This embodiment is different from the first embodiment of the invention only in the foregoing. That is, the second embodiment of the invention is in accordance with the first embodiment of the invention in all the respects, such as configuration, conditions, procedure, and effect, that are not described above.

Third Embodiment

This embodiment is different from the first embodiment in the configuration of the pads MPD for chip. Hereafter, description will be given to a semiconductor device in this embodiment.

Figure 14:
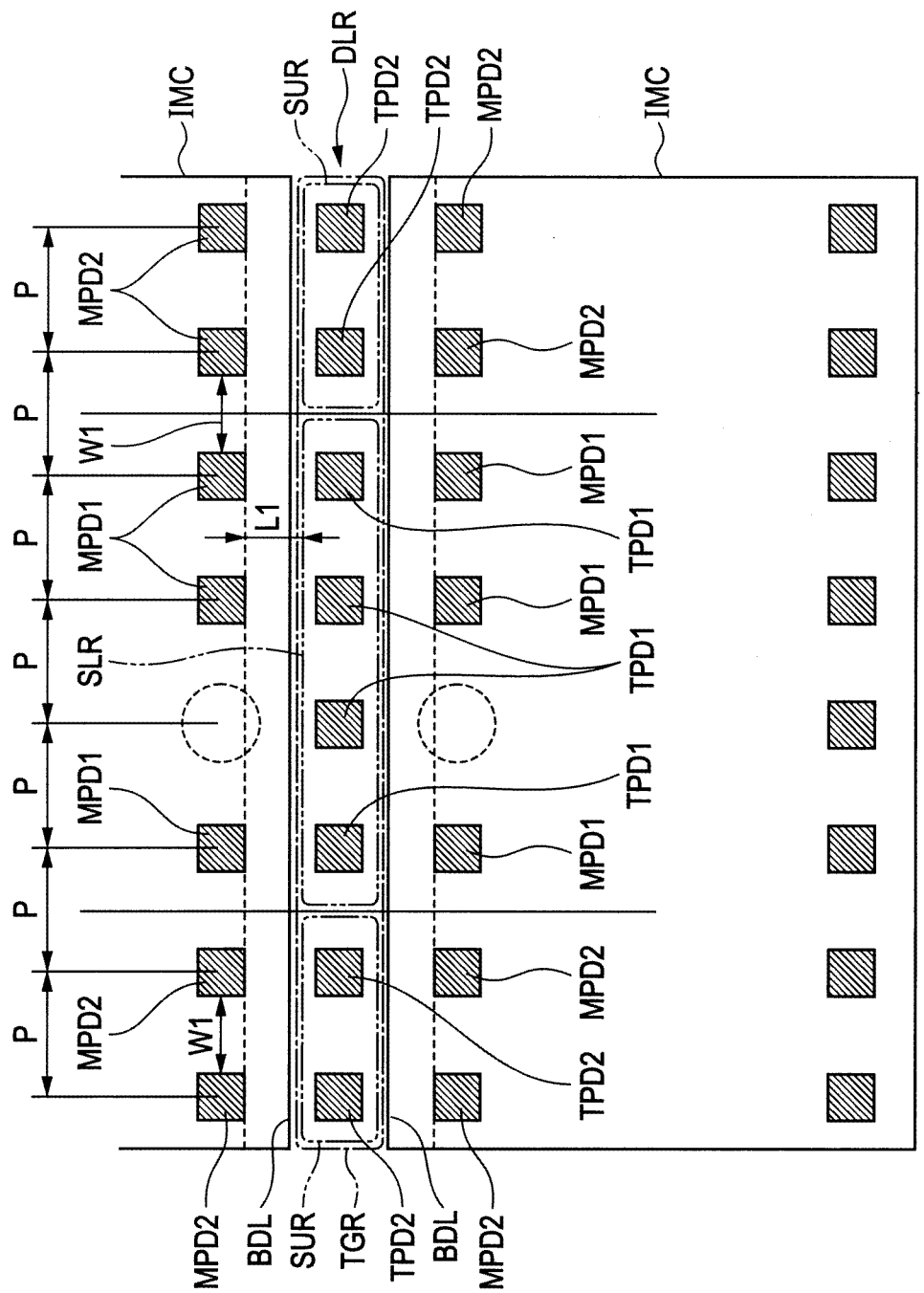
FIG. 14 is a schematic enlarged plan view of a semiconductor device in a third embodiment, similar to FIG. 2.

In the semiconductor device in this embodiment, as illustrated in FIG. 14, all the pads for chip and the pads for TEG are basically identical in size as viewed in a plane. The distance between every pad for chip and the border line BDL is substantially identical (for example, L1 in FIG. 2). The arrangement pitch between adjacent pads for chip and between adjacent pads for TEG basically has a certain value (P) and the interval between pads for TEG also has a certain value (W1). The pads for chip are respectively formed in positions opposite the pads for TEG. That is, the following pads are both arranged with the identical arrangement pitch P: the pads MPD1 for chip opposite the region SLR for which short-circuiting is prone to occur and the pads MPD2 for chip opposite the region SUR for which short-circuiting is less prone to occur.

In this embodiment, however, the following measure is taken in part of the region opposite the region SLR for which short-circuiting is prone to occur: a pad MPD for chip is not formed in a position where a pad MPD1 for chip should be otherwise placed. That is, pads MPD1 for chip are thinned out and a pad MPD1 for chip is not formed in a position where a pad MPD1 for chip should be otherwise formed in the chip region IMC. This position is located opposite a pad TPD1 for TEG and indicated by a circular broken line in FIG. 14.

The semiconductor device in FIG. 14 is substantially identical with the semiconductor device in the first embodiment except the foregoing. In the description of this embodiment, therefore, the same elements as in the first embodiment will be marked with the same reference codes and the description thereof will not be repeated.

Description will be given to the action and effect of this embodiment. The occurrence of short-circuiting arising from the following event can be suppressed by providing a region where pads MPD1 for chip are thinned out as in this embodiment: a chipping wire CPD2 (Refer to FIG. 6) produced during dicing flies off to a position where it is placed astride adjacent pads MPD1 for chip. This is because when pads MPD1 for chip are thinned out, the arrangement pitch between the pads MPD1 for chip is accordingly increased and the possibility that pads MPD1 for chip are short-circuited in that region is reduced. In the example in FIG. 14, specifically, the following takes place in the area, encircled with a circular broken line, where a pad MPD1 for chip is not formed: the arrangement pitch between pads MPD1 for chip is 2P, which is twice the arrangement pitch in the other areas.

In the above example, the planar shape of each of the pads MPD1 for chip and that of each of the pads MPD2 for chip are identical in size. This makes it possible to suppress such a problem that short-circuiting is prone to occur in a specific area.

This embodiment is different from the first embodiment of the invention only in the foregoing. That is, the third embodiment of the invention is in accordance with the first embodiment of the invention in all the respects, such as configuration, conditions, procedure, and effect, that are not described above.

Fourth Embodiment

This embodiment is different from the first embodiment in the configurations of the pads for chip and the pads for TEG. Hereafter, description will be given to a semiconductor device in this embodiment.

Figure 15:
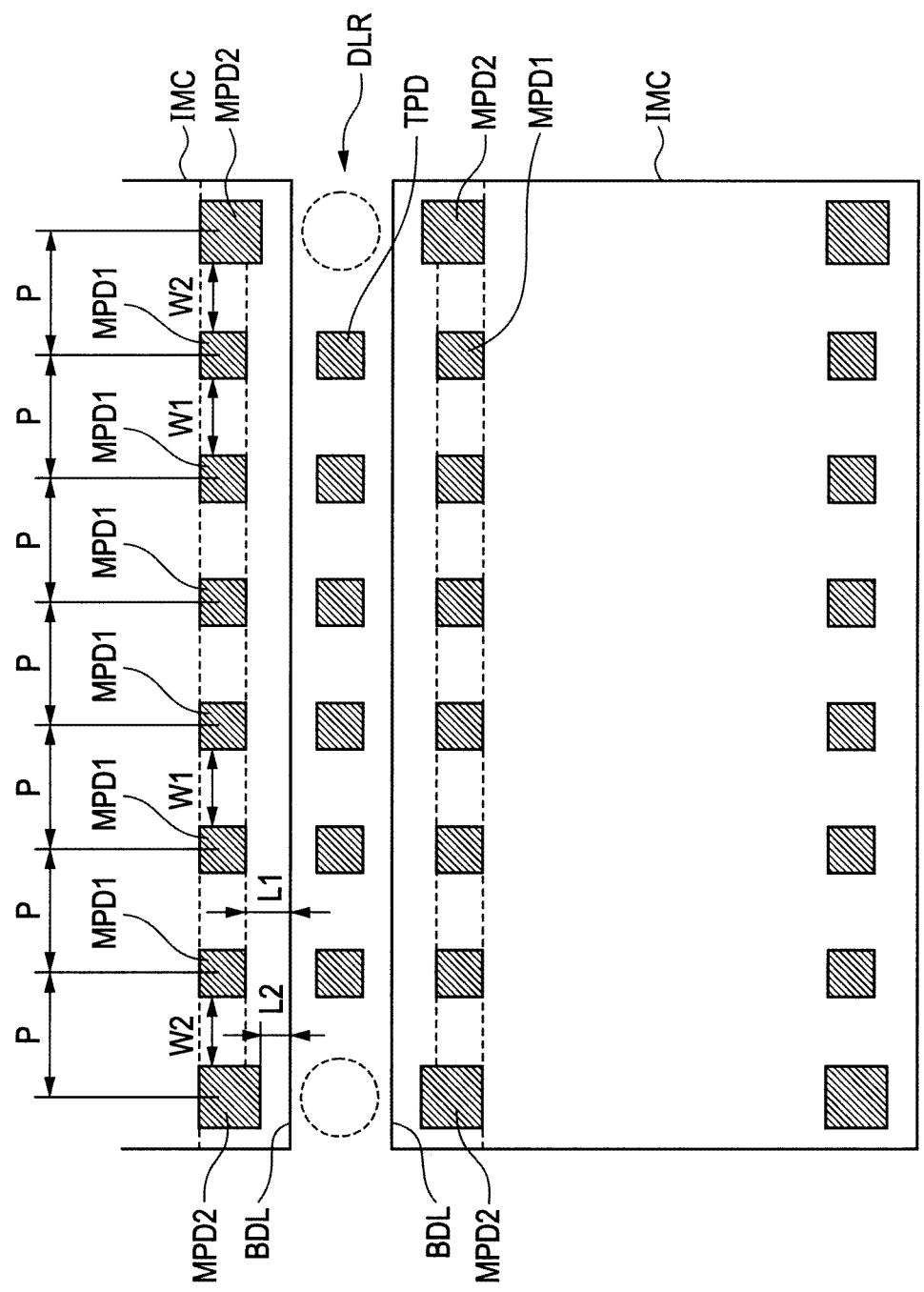
FIG. 15 is a schematic enlarged plan view of a semiconductor device in a fourth embodiment, similar to FIG. 2.

As illustrated in FIG. 15, the semiconductor device in this embodiment includes the following: multiple pads MPD1, MPD2 for chip (first pads) formed in each of multiple chip regions IMC; and multiple pads TPD for TEG (second pads) formed in each of multiple dicing line regions DLR.

The pads MPD1, MPD2 for chip and the pads TPD for TEG are respectively arranged in line along the border line (one side of the outer edge of a chip region IMC) BDL. The pads MPD1, MPD2 for chip arranged in line includes: pads MPD1 for chip (center pads) arranged in the central part and pads MPD2 for chip (end pads) respectively placed at both ends of the center pads MPD1. The planar shape of each of the end pads MPD2 is larger than the planar shape of each of the center pads MPD1. Each of the center pads MPD1 is identical in planar shape (shape and dimensions). The pads TPD for TEG are placed in a position opposite the region where the center pads MPD1 are arranged. A pad TPD for TEG is not placed in a position opposite the regions where the end pad MPD2 is placed. (This position is equivalent to the areas encircled with a circular broken line in FIG. 15.)

The center pads MPD1 and the end pads MPD2 are so arranged that the arrangement pitch P between center pads MPD1 and the arrangement pitch P between the center pads MPD1 and the end pads MPD2 are identical with each other. Further, the center pads MPD1 and the end pads MPD2 are so arranged that the interval W1 between center pads MPD1 is longer than the interval W2 between the center pads MPD1 and the end pads MPD2.

The position in each of the center pads MPD1 farthest away form the border line BDL is aligned with the position in each of the end pads MPD2 farthest from the border line BDL.

Though not shown in FIG. 15, TEGs electrically coupled to pads TPD for TEG, wires, and the like are formed in the dicing line region DLR as in the other embodiments. However, such TEG, a wire, or the like is not formed in the areas of the dicing line region DLR opposite the end pads MPD2 for chip.

Figure 16:
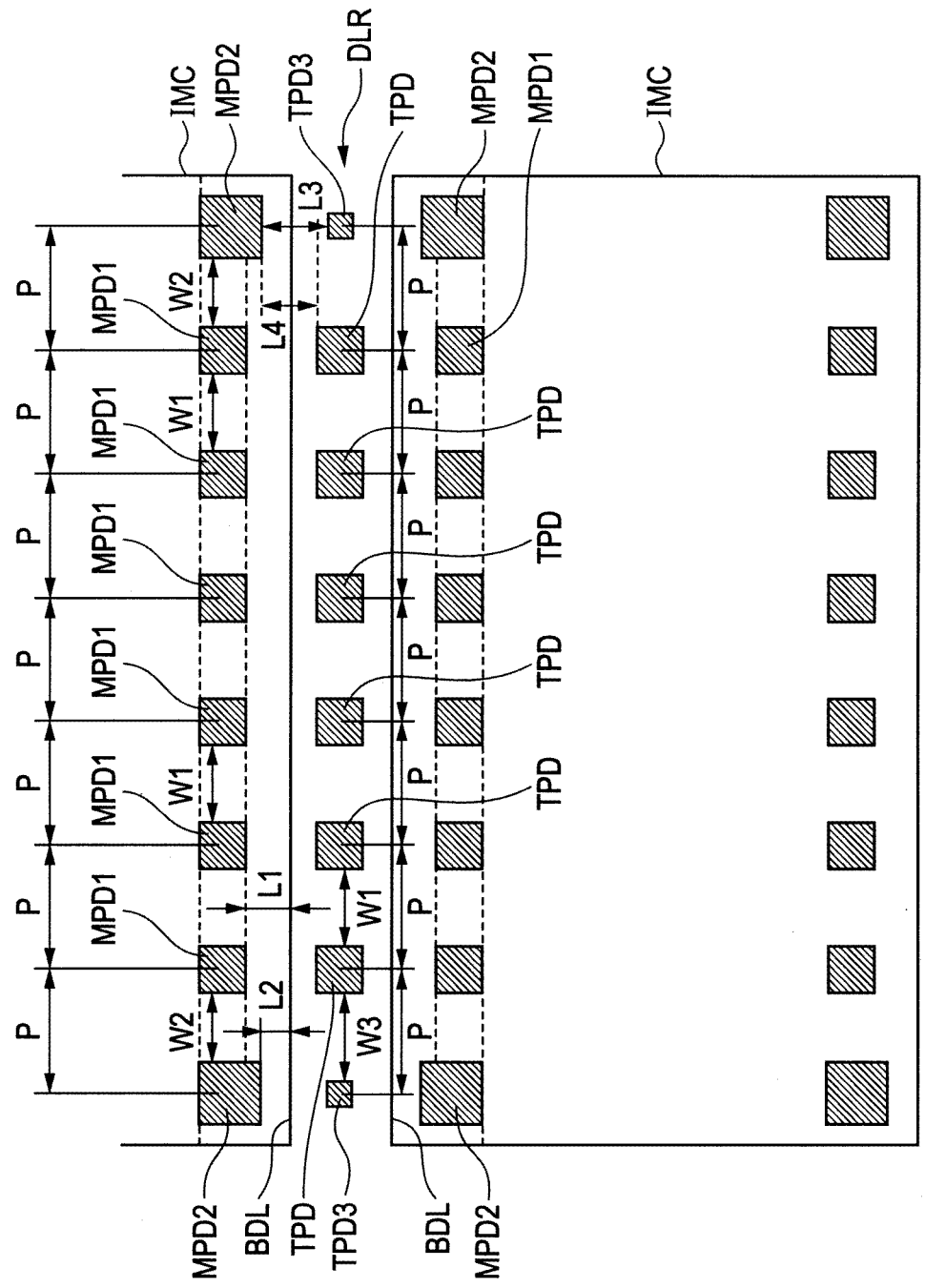
FIG. 16 is a schematic enlarged plan view illustrating a first modification to the arrangement of pads in a semiconductor device in the fourth embodiment.

The first modification to this embodiment illustrated in FIG. 16 has substantially the same aspects as in FIG. 15. However, the semiconductor device in FIG. 16 is different from that in FIG. 15 in the following points. That is, the pads for chip (first pads) include center pads MPD1 (first center pads) arranged at the central part and end pads MPD2 (first end pads) respectively placed at both ends of the center pads MPD1. In addition, pads TPD3 for TEG (second end pads) are arranged as pads for TEG (second pads) opposite the regions where the end pads MPD2 are placed.

In the semiconductor device in FIG. 16, each of the pads TPD3 for TEG has a planar shape smaller than that of each of the pads TPD for TEG (second center pads) as viewed in plane. However, the arrangement pitch P between the pads TPD3 for TEG and the pads TPD for TEG adjoining thereto is substantially equal to the arrangement pitch P between pads TPD for TEG. Further, the distance between the center of each of the pads TPD3 for TEG and the border line BDL is substantially equal to the distance between the center of each of the pads TPD for TEG and the border line BDL.

This makes the interval W3 between the pads TPD3 for TEG and the pads TPD for TEG adjoining thereto longer than the interval W1 between adjacent pads TPD for TEG. Further the distance L3 between the pads TPD3 for TEG and the end pads MPD2 located opposite thereto is longer than the following distance: the distance L4 between virtual pads TPD for TEG having their center in the same position as that of the pads TPD3 for TEG (having a planar shape in the same size as that of the pads TPD for TEG) and the end pads MPD2.

The other configuration elements of the semiconductor device in FIG. 16 are the same as those of the semiconductor device in FIG. 15. Therefore, the same elements will be marked with the same reference codes and the description thereof will not be repeated.

Figure 17:
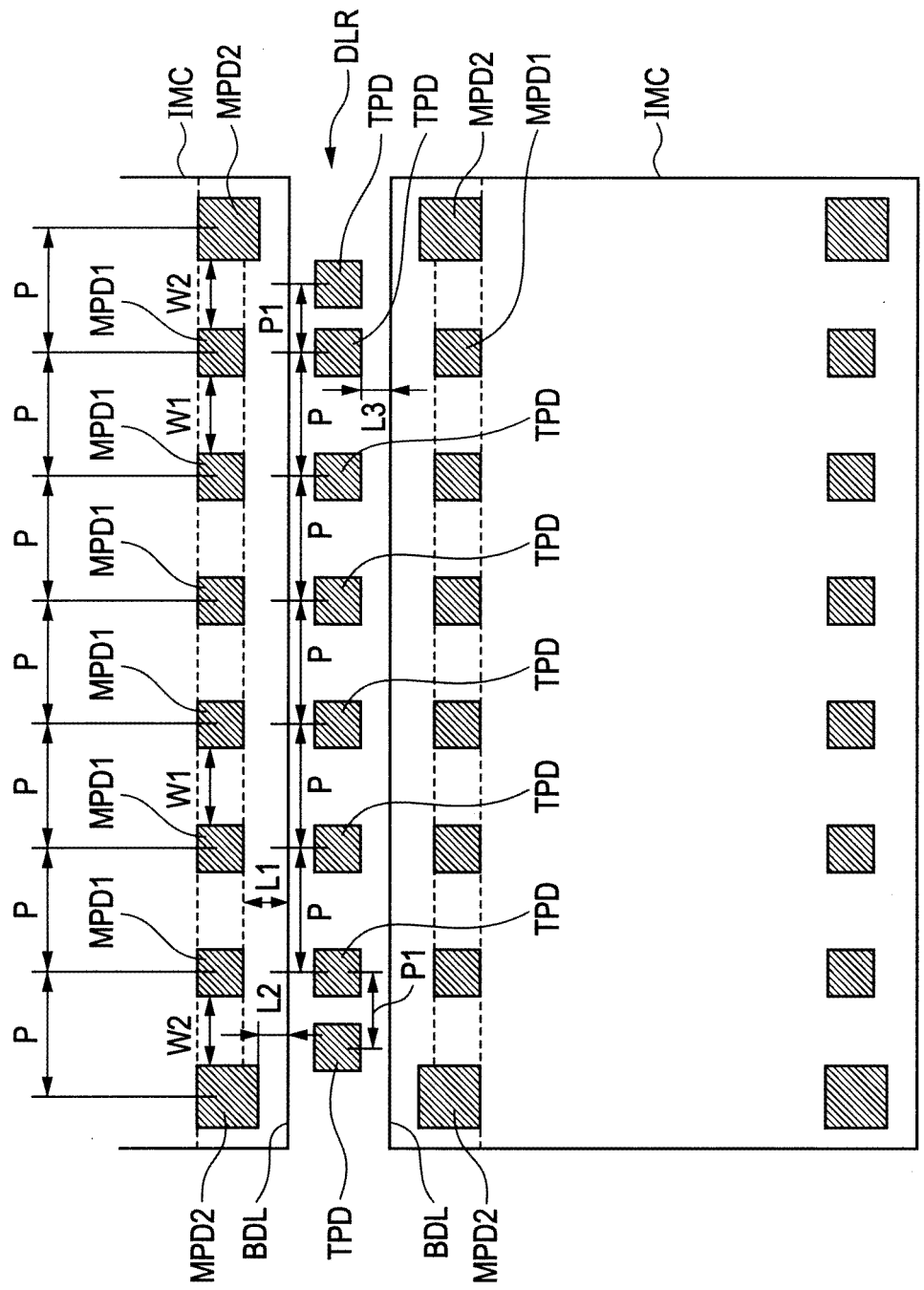
FIG. 17 is a schematic enlarged plan view illustrating a second modification to the arrangement of pads in a semiconductor device in the fourth embodiment.

The semiconductor device in a second modification to this embodiment illustrated in FIG. 17 has substantially the same aspects as the semiconductor device in FIG. 16. In the example in FIG. 17, however, the following measure is taken with respect to the pads TPD for TEG: the arrangement pitch P1 between pads TPD for TEG placed between the central part where pads TPD for TEG are arranged and the end parts is smaller than the arrangement pitch P between pads TPD for TEG arranged on the central part side. Of the pads TPD for TEG arranged in line, the pads TPD for TEG placed at the endmost parts may be placed in positions opposite the first end pads MPD2. Or, they may be placed closer to the central part than the positions opposite the first end pads MPD2.

The size of the planar shape of each of the pads TPD for TEG placed at the endmost parts in FIG. 17 is equal to the size of the planar shape of each of the pads TPD for TEG. The distance L3 between every pad TPD for TEG and the border line BDL is identical.

The other configuration elements of the semiconductor device in FIG. 17 are the same as those of the semiconductor device in FIG. 15. Therefore, the same elements will be marked with the same reference codes and the description thereof will not be repeated.

Figure 18:
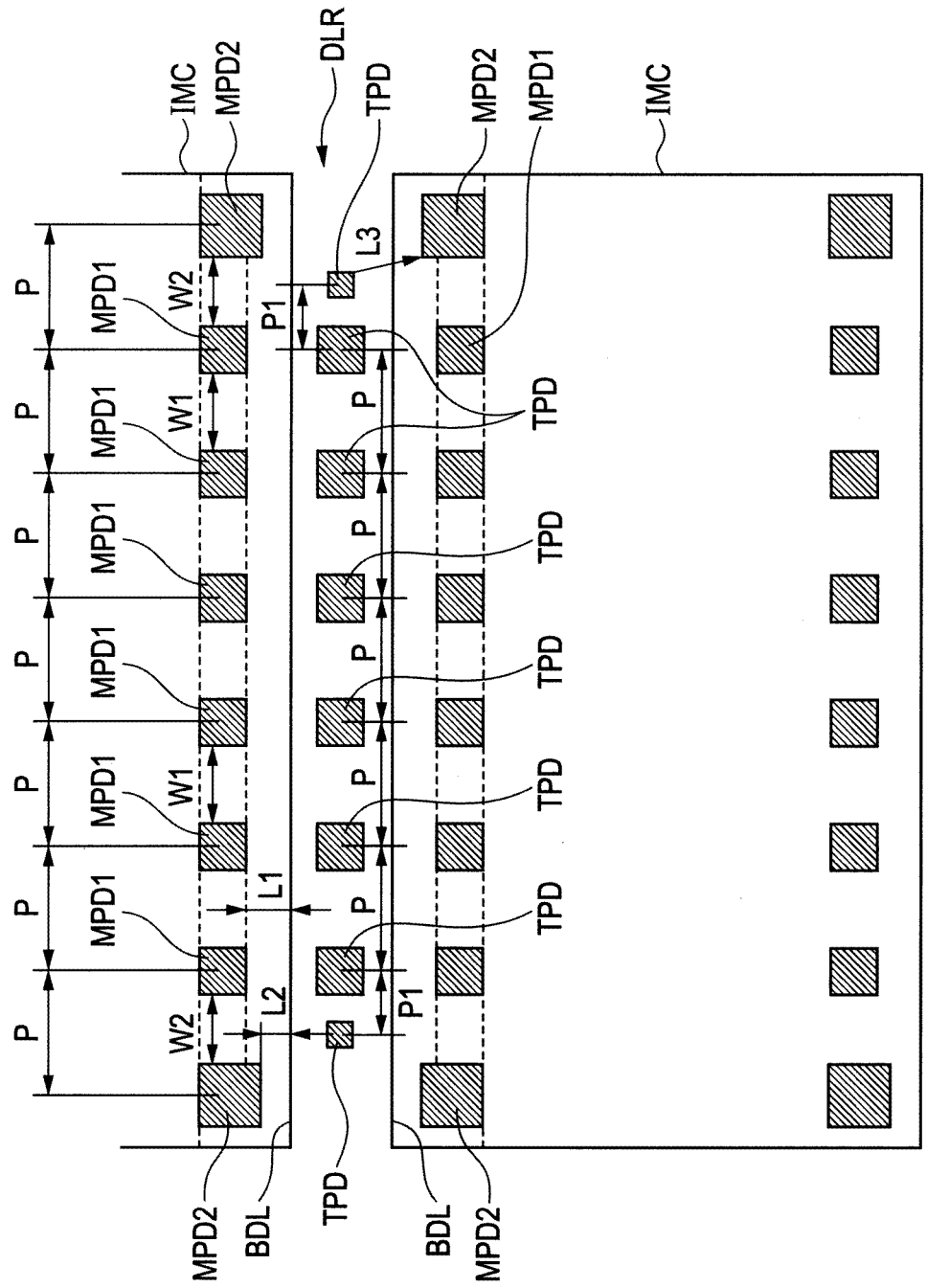
FIG. 18 is a schematic enlarged plan view illustrating a third modification to the arrangement of pads in a semiconductor device in the fourth embodiment.

The semiconductor device in a third modification to this embodiment illustrated in FIG. 18 has substantially the same aspects as the semiconductor device in FIG. 17. In the example in FIG. 18, however, of the pads TPD for TEG arranged in line, the pads TPD for TEG placed at the endmost parts have a planar shape smaller than that of the other pads TPD for TEG.

The distance between the center of each of the pads TPD for TEG placed at the endmost parts in FIG. 18 and the border line BDL is equal to the distance between the center of each of the other pads TPD for TEG and the border line BDL.

The other configuration elements of the semiconductor device in FIG. 18 are the same as those of the semiconductor device in FIG. 17. Therefore, the same elements will be marked with the same reference codes and the description thereof will not be repeated.

The material of the pads TPD3 for TEG in FIG. 16 is the same as the material of the pads TPD1, TPD2 for TEG in the first embodiment.

In this embodiment, short-circuiting is prone to occur also between pads at the central part in the horizontal direction. However, it will be assumed that short-circuiting is prone to occur especially between a pad for chip and a pad for TEG at the end parts in the horizontal direction in each drawing. In the example in FIG. 15, for this reason, pads TPD for TEG are thinned out in areas where short-circuiting is prone to occur. In the example in FIG. 16, the size of a pad for TEG is reduced in areas where short-circuiting is prone to occur. In the example in FIG. 17, the arrangement pitch between pads TPD for TEG is made smaller in areas where short-circuiting is prone to occur than in the other areas. In the example in FIG. 18, the pads TPD for TEG are reduced in size and arrangement pitch in areas where short-circuiting is prone to occur.

Description will be given to the action and effect of this embodiment. In this embodiment, as illustrated in FIG. 15, the planar shape of each of the center pads MPD1 is smaller than the planar shape of each of the end pads MPD2. For this reason, the interval W1 between center pads MPD1 is longer than the interval W2 between the end pads MPD2 and the center pads MPD1 adjoining thereto. Therefore, short-circuiting between center pads MPD1 can be suppressed.

Further, the distance L1 between each of the center pads MPD1 and the border line BDL is longer than the distance L2 between each of the end pads MPD2 and the border line BDL. This also makes it possible to suppress short-circuiting between center pads MPD1.

To an end pad MPD2, as described in relation to the second embodiment, usually, a bonding wire is bonded at an angle largely inclined from the direction orthogonal to the border line BDL as viewed in a plane. For this reason, if the planar shape of each of the end pads MPD2 is small, it is difficult to bond a bonding wire to the end pad MPD2. In this embodiment, meanwhile, the planar shape of each of the end pads MPD2 is larger than the planar shape of each of the center pads MPD1. For this reason, the above bonding of bonding wires is facilitated and the bond is more reliable.

As mentioned above, the planar shape of each of the end pads MPD2 is larger than the planar shape of each of the center pads MPD1. For this reason, the size of a flaw made on an end pad MPD2 when a probe is brought into contact is small for the ratio of the planar area of each of the end pads MPD2. Therefore, stable TEG measurement can be carried out. A failure in bonding of a bonding wire to an end pad is also suppressed and a semiconductor chip failure is less prone to occur and this enhances the reliability of semiconductor chips.

A pad TPD for TEG is not placed in a position opposite a region where an end pad MPD2 is placed. For this reason, any TEG piece flying off from a pad TPD for TEG opposite an end pad MPD2 does not arrive at the end pad MPD2 during dicing. This suppresses the occurrence of short-circuiting (between a pad TPD for TEG and an end pad MPD2) due to the TEG piece in an area (end part) where short-circuiting is prone to occur.

In the semiconductor device in the first modification to this embodiment illustrated in FIG. 16, as mentioned above, L3>L4. This makes it possible to reduce the possibility that chippings from pads TPD3 for TEG produced when the pads TPD3 for TEG are cut during dicing short-circuit an end pad MPD2 and a pad TPD3 for TEG.

In the semiconductor device in the second modification to this embodiment illustrated in FIG. 17, a measure is taken to implement the following: the arrangement pitch P1 between pads TPD for TEG arranged between the central part and the end parts is made smaller than the arrangement pitch P between pads TPD for TEG arranged on the central part side. For this reason, the wires, such as gate wire GEP, source wire SEP, and drain wire DEP, installed between pads TPD for TEG arranged between the central part and the end parts can be made shorter than the following wires: wires installed between pads TPD for TEG arranged on the central part side. This makes it possible to reduce the possibility that: a chipping wire CPD1 (Refer to FIG. 5), which is a broken piece produced when a gate wire GEP or the like is cut by dicing, flies off into a chip region IMC; and it short-circuits together adjacent pads for chip at an end part that are especially prone to short-circuit to each other.

In the semiconductor device in the third modification to this embodiment illustrated in FIG. 18, the same measure as in the semiconductor device in FIG. 16 is taken. That is, each of the pads TPD for TEG placed at the endmost parts has a planar shape smaller than each of the other pads TPD for TEG. For this reason, the shortest distance L3 between the pads TPD for TEG placed at the endmost parts and the end pads MPD2 illustrated in FIG. 18 is large as compared with, for example, the following cases: cases where the pads TPD for TEG have a larger planar shape. (The above shortest distance is not limited to that in the direction substantially perpendicular to the border line BDL). As in the semiconductor device in FIG. 16, this makes it possible to suppress the possibility that: chippings from the pads TPD for TEG at the endmost parts produced when the pads TPD for TEG placed at the endmost parts are cut during dicing short-circuit an end pad MPD2 and the pad TPD for TEG at the endmost part to each other.

In the semiconductor device in FIG. 18, further, short-circuiting between pads for chip can be suppressed by shortening a gate wire GEP and the like as in the semiconductor device in FIG. 17. Therefore, the semiconductor device in FIG. 18 brings about both the effect of the semiconductor device in FIG. 16 and the effect of the semiconductor device in FIG. 17.

This embodiment is different from the first embodiment of the invention only in the foregoing. That is, the fourth embodiment of the invention is in accordance with the first embodiment of the invention in all the respects, such as configuration, conditions, procedure, and effect, that are not described above.

A semiconductor device of the invention may be configured by appropriately combining the above-mentioned embodiments. In this case, the effect obtained by combining the effects described in relation to these embodiments can be similarly brought about.

Figure 19:
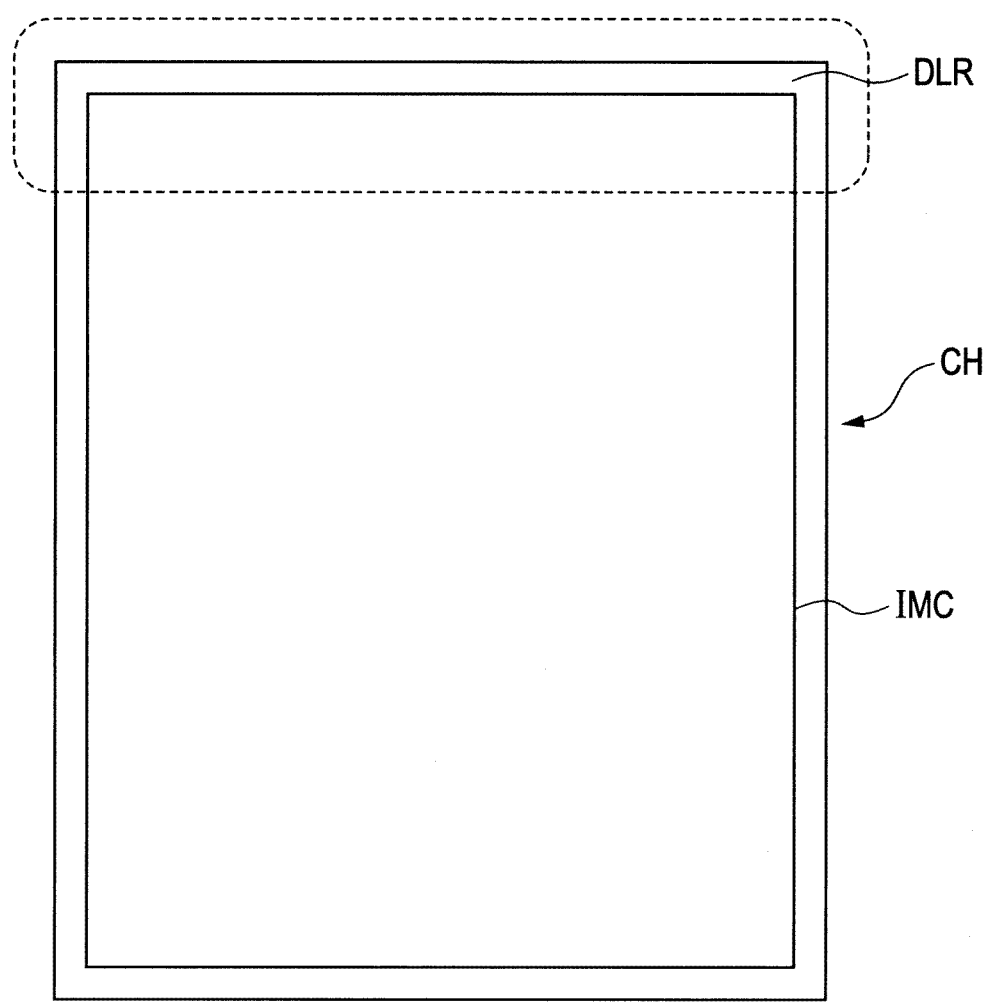
FIG. 19 is a schematic plan view illustrating the state of a semiconductor chip obtained after a semiconductor wafer related to the invention is diced.
Figure 20:
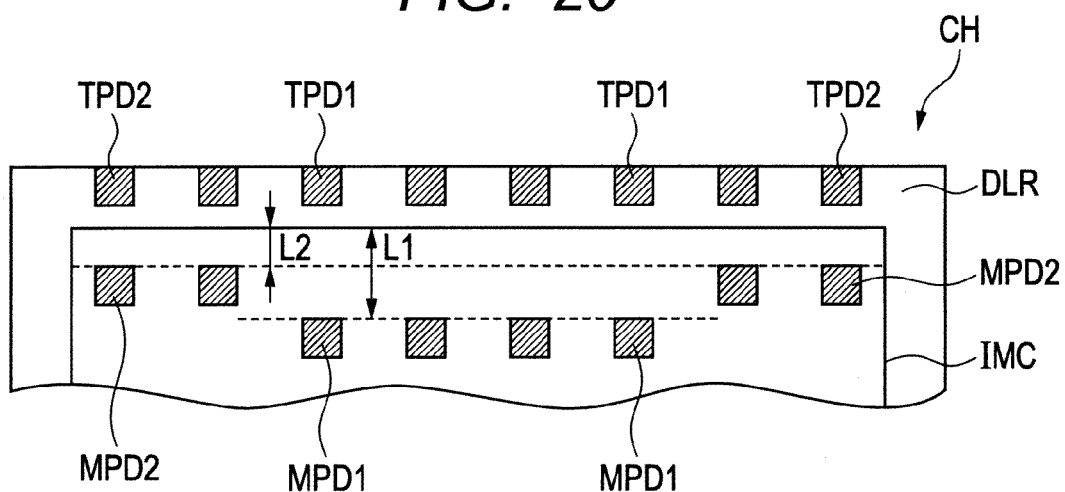
FIG. 20 is a schematic enlarged plan view illustrating the state of the area encircled with a circular broken line in FIG. 19, in a semiconductor chip in the first embodiment.
Figure 21:
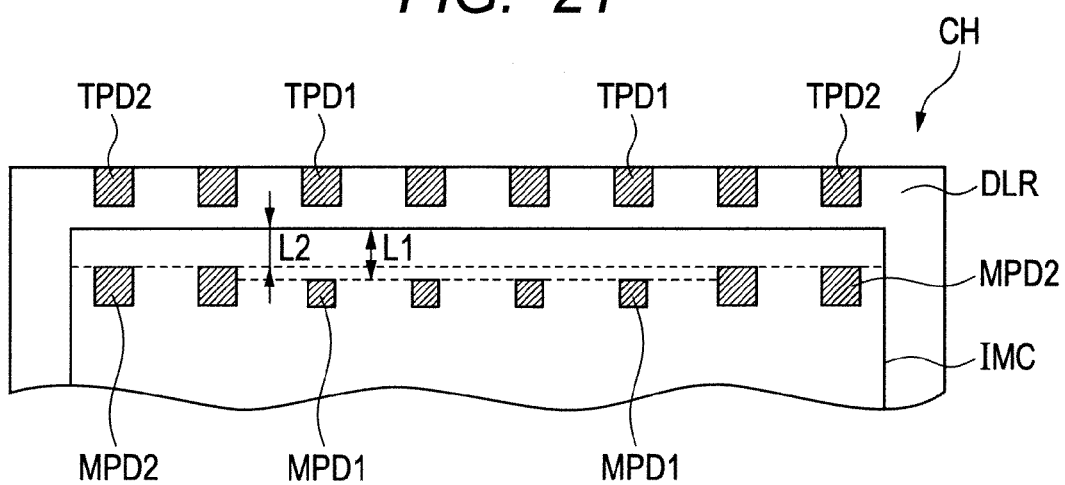
FIG. 21 is a schematic enlarged plan view illustrating the state of the area encircled with a circular broken line in FIG. 19, in a semiconductor chip in the second embodiment.
Figure 22:
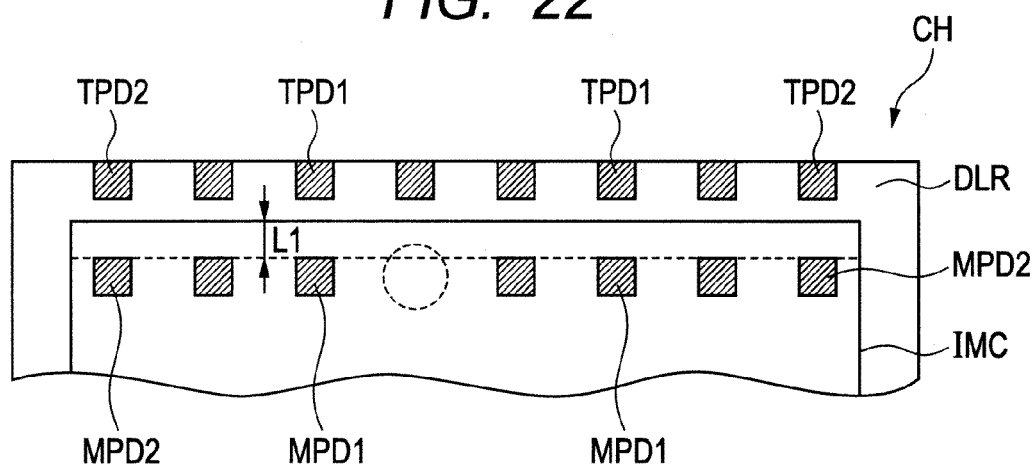
FIG. 22 is a schematic enlarged plan view illustrating the state of the area encircled with a circular broken line in FIG. 19, in a semiconductor chip in the third embodiment.
Figure 23:
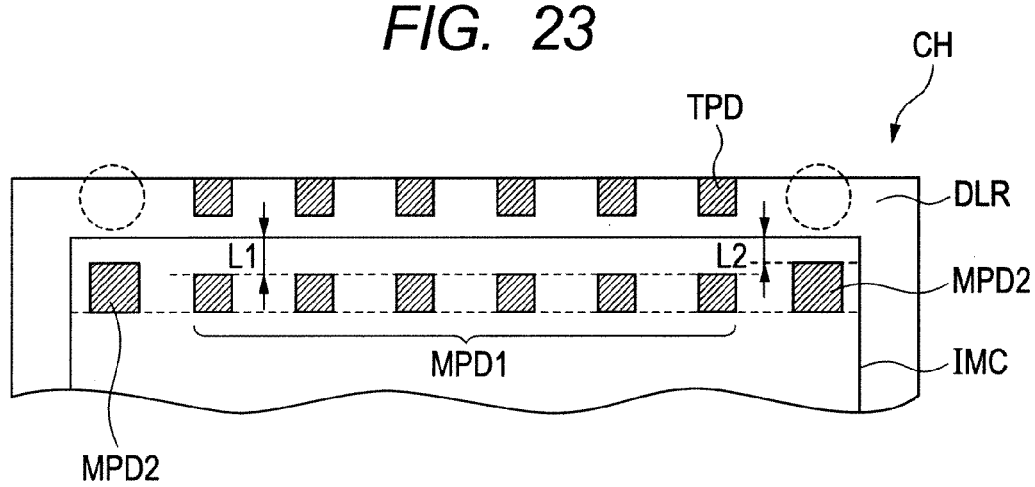
FIG. 23 is a schematic enlarged plan view illustrating the state of the area encircled with a circular broken line in FIG. 19, in a semiconductor chip in the fourth embodiment.

As illustrated in FIG. 19, the following measure is taken in a semiconductor chip CH obtained by dicing the semiconductor wafer SW described in relation to each of the above embodiments: a chip region IMC is arranged in the central part and the dicing line region DLR is so arranged that it surrounds the chip region IMC. In the area encircled with a broken line in FIG. 19, the following pads are formed: pads MPD1, MPD2 for chip and pads TPD1, TPD2 for TEG variously arranged and sized in relation to the respective representative examples of the first embodiment to the fourth embodiment illustrated in FIG. 20 to FIG. 23.

The embodiments disclosed here should be considered to be exemplary in all the respects and should not be considered to be limitative. The scope of the invention is indicated by

WHAT IS CLAIMED IS, not by the above description and it is intended to include all the modifications within the meaning and the scope equivalent to WHAT IS CLAIMED IS.

The invention can be especially advantageously applied to semiconductor devices with multiple pads for characteristic evaluation formed therein.

What is claimed is:

1. A semiconductor device comprising:
a semiconductor substrate having a main surface and having in the main surface an element formation region and a dicing line region surrounding the element formation region;
a plurality of first pads formed in the element formation region; and
a plurality of second pads formed in the dicing line region,
wherein the first pads and the second pads are arranged across each other along a first edge of the element formation region,
wherein a first distance is a closest distance between a third pad of the first pads and the first edge of the element formation region,
a second distance is a closest distance between a fourth pad of the first pads and the first edge of the element formation region,
a third distance is a closest distance between a fifth pad of the second pads closest with the third pad and the first edge of the element formation region,
a fourth distance is a closest distance between a sixth pad of the second pads closest with the fourth pad and the first edge of the element formation region,
the third distance and the fourth distance are substantially the same distance,
the third pad is aligned with the fifth pad across the first edge of the element formation region with no intervening first pads therebetween and the fourth pad is aligned with the sixth pad across the first edge of the element formation region with no intervening first pads therebetween, and
the first distance is longer than the second distance.

2. A semiconductor device according to claim 1, wherein there is a long signal line in the dicing line region near the third pad, and
there is no long signal line in the dicing line region near the fourth pad.

3. A semiconductor device according to claim 1, wherein there is a circuit for evaluation in the dicing line region near the third pad, and
there is no circuit for the evaluation in the dicing line region near the fourth pad.

4. The semiconductor device according to claim 1, wherein each of the first pads is arranged with the same pitch.

5. The semiconductor device according to claim 1, wherein the arrangement pitch of some first pads is larger than the arrangement pitch of the remaining first pads.

6. The semiconductor device according to claim 1, wherein each of the first pads is arranged at the same intervals.

7. The semiconductor device according to claim 1, wherein the intervals at which some first pads are arranged are longer than the intervals at which the remaining first pads are arranged.

8. The semiconductor device according to claim 1, wherein each of the first pads has a planar shape in the same size.

9. The semiconductor device according to claim 2, wherein the distance between some first pads and the first edge is longer than the distance between the remaining first pads and the first edge.

* * * * *